United States Patent
Pagani

(10) Patent No.: US 10,775,426 B2
(45) Date of Patent: *Sep. 15, 2020

(54) SYSTEM AND METHOD FOR ELECTRICAL TESTING OF THROUGH SILICON VIAS (TSVS)

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 339 days.

This patent is subject to a terminal disclaimer.

(21) Appl. No.: 15/841,585

(22) Filed: Dec. 14, 2017

(65) Prior Publication Data
US 2018/0106854 A1  Apr. 19, 2018

Related U.S. Application Data

(63) Continuation of application No. 14/827,796, filed on Aug. 17, 2015, now Pat. No. 9,874,598, which is a (Continued)

(30) Foreign Application Priority Data

Feb. 16, 2010  (IT) .............................. TO2010A0109

(51) Int. Cl.
*G01R 31/26* (2020.01)
*H01L 21/66* (2006.01)
(Continued)

(52) U.S. Cl.
CPC ....... *G01R 31/275* (2013.01); *G01R 31/2853* (2013.01); *H01L 21/76898* (2013.01);
(Continued)

(58) Field of Classification Search
CPC ............ G01R 31/2853; G01R 31/2884; G01R 31/3004; H01L 21/486; H01L 21/561;
(Continued)

(56) References Cited

U.S. PATENT DOCUMENTS 4,967,248 A * 10/1990 Shimizu ............ H01L 27/10829
257/304
5,175,607 A  12/1992 Ikeda
(Continued)

FOREIGN PATENT DOCUMENTS

CN         100379003 C   4/2008
WO    WO-2009115449 A1   9/2009
(Continued)

OTHER PUBLICATIONS

Second Office Action and Search Report (with translation) from co-pending CN Appl. No. 201510316863.4 dated Dec. 25, 2017 (11 pages).

(Continued)

*Primary Examiner* — Minh N Tang
(74) *Attorney, Agent, or Firm* — Crowe & Dunlevy

(57) ABSTRACT

A testing system for carrying out electrical testing of at least one first through via forms an insulated via structure extending only part way through a substrate of a first body of semiconductor material. The testing system has a first electrical test circuit integrated in the first body and electrically coupled to the insulated via structure. The first electrical test circuit enables detection of at least one electrical parameter of the insulated via structure.

32 Claims, 17 Drawing Sheets

Related U.S. Application Data continuation of application No. 13/579,562, filed as application No. PCT/EP2011/052319 on Feb. 16, 2011, now Pat. No. 9,111,895.

(51) Int. Cl.
  *H01L 21/768* (2006.01)
  *G01R 31/27* (2006.01)
  *H01L 23/48* (2006.01)
  *G01R 31/28* (2006.01)

(52) U.S. Cl.
  CPC ............ *H01L 22/34* (2013.01); *H01L 23/481* (2013.01); *H01L 2924/0002* (2013.01)

(58) Field of Classification Search
  CPC ... H01L 21/565; H01L 21/568; H01L 21/763; H01L 21/76898; H01L 22/34; H01L 23/481
  See application file for complete search history.

(56) References Cited

U.S. PATENT DOCUMENTS

| | | | |
|---|---|---|---|
| 5,635,753 A | 6/1997 | Hofflinger et al. | |
| 5,814,889 A | 9/1998 | Gaul | |
| 6,495,454 B2 | 12/2002 | Livengood et al. | |
| 6,921,961 B2 | 7/2005 | Sanchez et al. | |
| 7,304,356 B2 | 12/2007 | Takahashi | |
| 7,541,203 B1 | 6/2009 | Knickerbocker | |
| 7,547,958 B2 | 6/2009 | Toyoda | |
| 7,893,529 B2 | 2/2011 | Hsu et al. | |
| 7,906,363 B2 | 3/2011 | Koyanagi | |
| 8,018,031 B2 | 9/2011 | Yanagida | |
| 8,063,654 B2 | 11/2011 | Rahman et al. | |
| 8,097,964 B2 | 1/2012 | West et al. | |
| 8,159,049 B2 | 4/2012 | Hietanen | |
| 8,232,115 B2 | 7/2012 | Ding et al. | |
| 8,299,583 B2 | 10/2012 | Zhu | |
| 8,354,327 B2 | 1/2013 | Zengxiang et al. | |
| 8,476,708 B2 | 7/2013 | Fukuzumi et al. | |
| 8,501,587 B2 | 8/2013 | Chen et al. | |
| 8,742,535 B2 | 6/2014 | Bachman et al. | |
| 9,029,988 B2 | 5/2015 | Cheng et al. | |
| 9,111,895 B2 | 8/2015 | Pagani | |
| 9,209,305 B1 | 12/2015 | Zhang et al. | |
| 9,269,789 B2 | 2/2016 | Moens et al. | |
| 9,337,292 B1 | 5/2016 | Ali | |
| 9,401,312 B1 | 7/2016 | Kannan et al. | |
| 9,478,470 B2 | 10/2016 | Pagani | |
| 9,543,397 B2 | 1/2017 | Kleemeier et al. | |
| 9,570,196 B2 | 2/2017 | Vogelsang et al. | |
| 9,588,174 B1 | 3/2017 | Robertazzi | |
| 9,673,316 B1 | 6/2017 | Blair et al. | |
| 9,754,790 B2 | 9/2017 | Lee | |
| 9,793,364 B2 | 10/2017 | Hamann et al. | |
| 9,874,598 B2 * | 1/2018 | Pagani .............. | H01L 21/76898 |
| 9,966,318 B1 | 5/2018 | Pagani | |
| 10,338,133 B2 | 7/2019 | Chakrabarty et al. | |
| 10,401,422 B2 | 9/2019 | Kang et al. | |
| 2005/0101054 A1 | 5/2005 | Mastromatteo et al. | |
| 2009/0065904 A1 | 3/2009 | Wang | |
| 2010/0144118 A1 | 6/2010 | Yang et al. | |
| 2010/0295600 A1 | 11/2010 | Kim et al. | |
| 2010/0332177 A1 | 12/2010 | Wu et al. | |
| 2011/0080184 A1 | 4/2011 | Wu et al. | |
| 2011/0080185 A1 | 4/2011 | Wu et al. | |
| 2011/0102006 A1 | 5/2011 | Choi et al. | |
| 2011/0201151 A1 | 8/2011 | Gambino et al. | |
| 2011/0304010 A1 | 12/2011 | Jiang et al. | |
| 2012/0025841 A1 | 2/2012 | Kim et al. | |
| 2012/0025846 A1 | 2/2012 | Minas et al. | |
| 2012/0146711 A1 | 6/2012 | Bartley et al. | |
| 2012/0153280 A1 | 6/2012 | Kim et al. | |
| 2012/0153437 A1 | 6/2012 | Chen et al. | |
| 2012/0211829 A1 | 8/2012 | Bartley et al. | |
| 2012/0248580 A1 | 10/2012 | Matsugai et al. | |
| 2012/0256319 A1 | 10/2012 | Mitsuhashi | |
| 2012/0280231 A1 | 11/2012 | Ito et al. | |
| 2012/0292746 A1 | 11/2012 | Lee et al. | |
| 2013/0001548 A1 | 1/2013 | Jeong et al. | |
| 2013/0001676 A1 | 1/2013 | Bartley et al. | |
| 2013/0006557 A1 | 1/2013 | Chakrabarty et al. | |
| 2013/0015502 A1 | 1/2013 | Fox et al. | |
| 2013/0020662 A1 | 1/2013 | Kao et al. | |
| 2013/0057312 A1 | 3/2013 | Pagani | |
| 2013/0069062 A1 | 3/2013 | Bhoovaraghan et al. | |
| 2013/0147057 A1 | 6/2013 | Horng et al. | |
| 2013/0169355 A1 | 7/2013 | Chen et al. | |
| 2013/0181349 A1 | 7/2013 | Koyama et al. | |
| 2013/0256661 A1 | 10/2013 | Pagani | |
| 2013/0285694 A1 | 10/2013 | Graves-Abe et al. | |
| 2014/0054742 A1 | 2/2014 | Katti | |
| 2014/0070838 A1 | 3/2014 | Vukic et al. | |
| 2014/0210497 A1 | 7/2014 | Endo | |
| 2014/0225624 A1 | 8/2014 | Chakrabarty et al. | |
| 2014/0232012 A1 | 8/2014 | Arai et al. | |
| 2014/0248721 A1 | 9/2014 | Kobayashi | |
| 2014/0266291 A1 | 9/2014 | Fkih et al. | |
| 2015/0028914 A1 | 1/2015 | Kim | |
| 2015/0102395 A1 | 4/2015 | Park et al. | |
| 2015/0160289 A1 | 6/2015 | Kolluru et al. | |
| 2015/0228547 A1 | 8/2015 | Shih | |
| 2016/0118377 A1 | 4/2016 | Moens et al. | |
| 2016/0218134 A1 | 7/2016 | Umebayashi et al. | |
| 2016/0258996 A1 | 9/2016 | Lim et al. | |
| 2018/0226307 A1 | 8/2018 | Pagani | |

FOREIGN PATENT DOCUMENTS

| | | |
|---|---|---|
| WO | WO-2011061043 A3 | 10/2011 |
| WO | 2013033628 A1 | 3/2013 |

OTHER PUBLICATIONS

INPI Search Report for IT TO2010A000109 dated Sep. 3, 2010 (2 pages).

Po-Yuan Chen, Cheng-Wen Wu, and Ding-Ming Kwai; On-Chip TSV Testing for 3D IC before Bonding Using Sense Amplification, 2009 Asian Test Symposium, ATS '09, IEEE, Nov. 23, 2009 (Nov. 23, 2009), pp. 450-455, XP031584421.

Menglin Tsai, Amy Klooz, Alexander Leonard, Jennie Appel, Paul Franzon; Through Silicon Via(TSV) Defect/Pinhole Self Test Circuit for 3D-IC; 3D System Integration, 2009. 3DIC 2009. IEEE International Conference on, IEEE, Piscataway, NJ, USA, Sep. 28, 2009 (Sep. 28, 2009), pp. 1-8, XP031557996.

Hosali, Sharath, et al: "Through-Silicon Via Fabrication, Backgrind, and Handle Wafer Technologies," Springer Science+Business Media, LLC, 2008, pp. 85-95.

\* cited by examiner

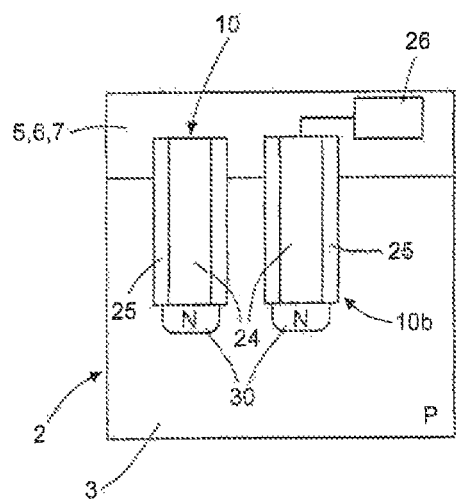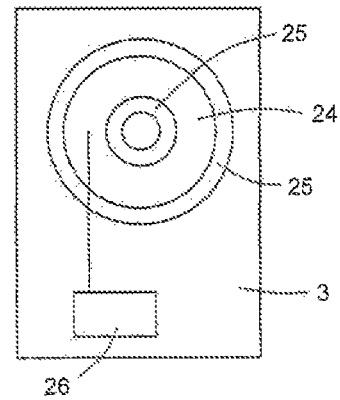
Fig.16a   Fig.16b
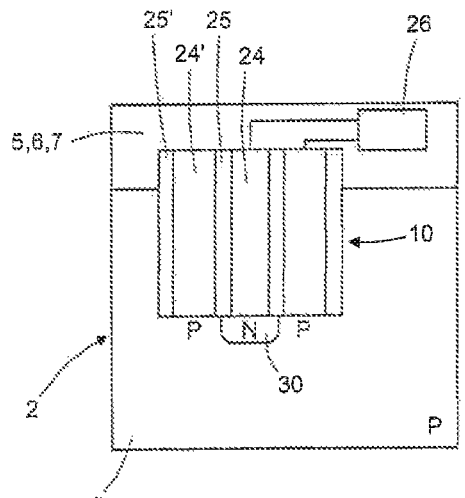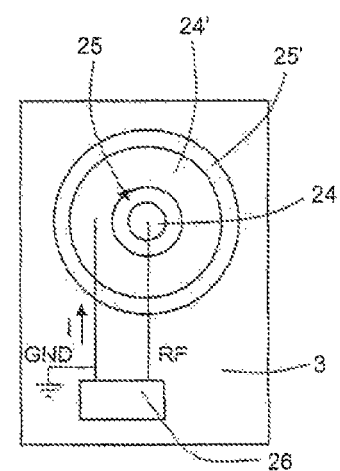
Fig.17a   Fig.17b

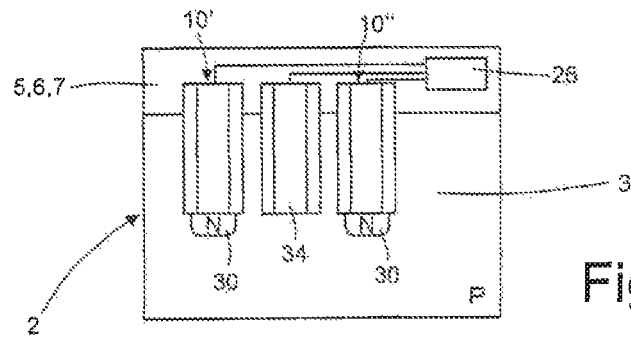
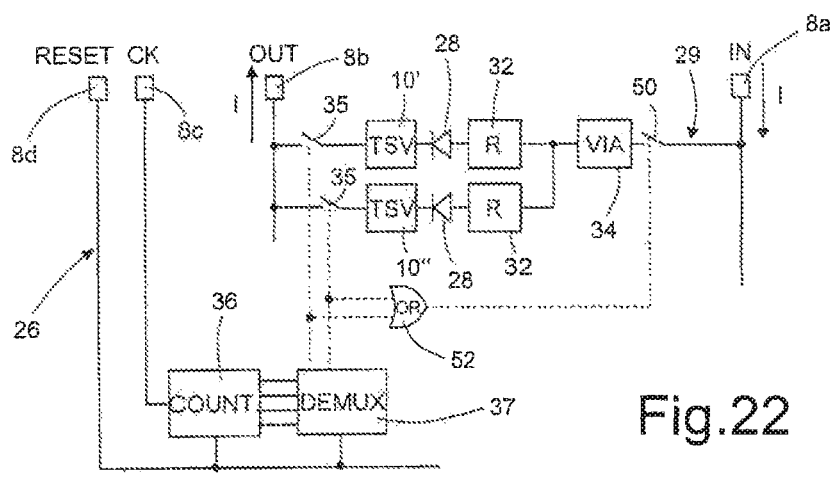
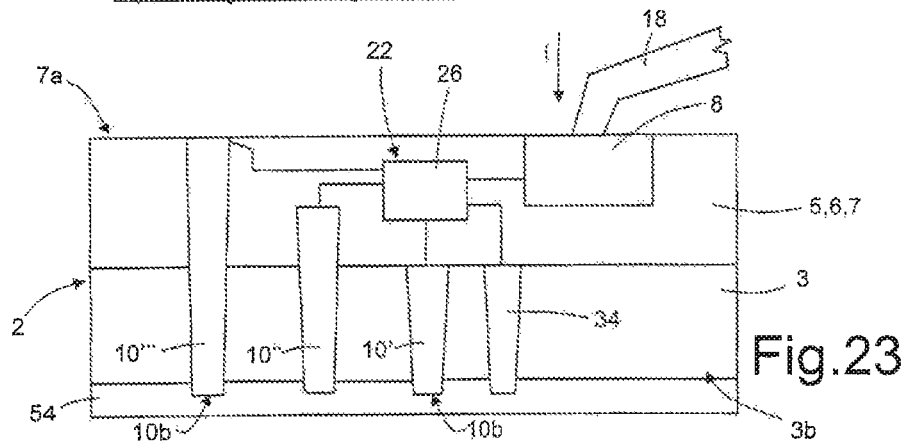

SYSTEM AND METHOD FOR ELECTRICAL TESTING OF THROUGH SILICON VIAS (TSVS)

CROSS-REFERENCE TO RELATED APPLICATIONS

This application is a continuation of U.S. patent application Ser. No. 14/827,796 filed Aug. 17, 2015 (now U.S. Pat. No. 9,874,598), which is a continuation of U.S. patent application Ser. No. 13/579,562 filed Nov. 2, 2012 (now U.S. Pat. No. 9,111,895) which is a national phase application filed pursuant to 35 U.S.C. 371 of International Patent Application No. PCT/EP2011/052319 filed Feb. 16, 2011, which claims priority to Italian Application for Patent No. TO2010A000109 filed Feb. 16, 2010, the disclosures of which are hereby incorporated by reference.

TECHNICAL FIELD

An embodiment relates to a system and to a method for electrical testing of through silicon vias (TSVs), in particular by means of a structural modification of the through vias.

BACKGROUND

As is known, a generic electronic integrated circuit is provided in a die (or, as used hereinafter, a chip) of semiconductor material, which is obtained, at the end of the manufacturing process, by dicing a wafer. The wafer generally comprises an active layer (for example, formed by a surface portion of a substrate), integrating one or more electronic components (either active or passive, for example transistors), or parts thereof, and one or more metallization and electrical-insulation layers extending on the active layer, to obtain the electronic components and their electrical interconnections.

The electrical connection between the electronic integrated circuit within the chip and an external electronic system is in general provided by conductive contact pads carried by an outer top surface of the chip, and electrical-connection wires that extend from the conductive pads towards similar connection elements of the external electronic system (this connection technique is generally known as "wire bonding" technique). In particular, the conductive pads form the terminations of electrical lines present in the chip and are designed for conveying information signals or power signals (among which electrical-supply signals for the electronic integrated circuit).

An alternative technique of electrical connection envisages use of conductive elements, projecting contact protuberances, or conductive balls or bumps, or conductive lands, directly connected to the conductive pads of the chip and set between the conductive pads themselves and similar connection elements of the external electronic system. In this case, the connection technique is usually defined as a "flip-chip technique", in so far as it envisages that the chip will be turned upside down in such a way that its outer top surface, which carries the conductive pads, is arranged facing the printed circuit board, or further electronic device, of the external electronic system.

In the field of electrical connections of electronic integrated circuits, moreover known is the use of the so-called through silicon vias (in what follows simply "through vias"), i.e., interconnections of conductive material that extend vertically through the chip of the electronic integrated circuit, enabling electrical connection of elements of the circuit, integrated at various levels of the structure of the chip, with an external surface thereof. The through vias are developed vertically through the chip and the corresponding substrate in such a way that, at the end of the manufacturing process, i.e., in their final form of use, they will be accessible from the outer surface of the chip designed for connection with the printed circuit board, or further electronic device, of the external electronic system, for example by being electrically contacted by the contact elements (bumps, balls, or lands) carried by said surface.

Generally, the through vias are electrically insulated from the substrate that they traverse in so far as they are insulated both laterally and underneath by an electrical-insulation region, for example constituted by dielectric material, in such a way as to avoid the presence of leakage currents towards the substrate itself.

FIG. 1 shows in a schematic and simplified way a generic electronic integrated circuit (IC) 1, provided in a wafer 2, comprising a substrate 3 of semiconductor material, integrated within which are, at least in part, electronic components 4, for example MOSFETs (as indicated schematically). In particular, the substrate 3 has a front surface 3a, in a position corresponding to which the electronic components 4 are provided, and a back surface 3b, opposite to the front surface 3a.

Arranged on the substrate 3, on one or more levels superimposed on one another, are electrical-insulation and metallization layers, schematically represented in FIG. 1 by an insulation layer 5, arranged on the front surface 3a of the substrate 3, and at least one metallization layer 6, arranged on the insulation layer 5. In a known way, appropriate structures, either conductive or insulating, of the electronic components 4 may moreover extend on the substrate 3 (for example, to obtain a gate oxide and a gate conductive structure of a MOSFET). In addition, the insulation and metallization layers 5, 6 provide the electrical connections between the electronic components 4, and the electrical connections towards the outside of the electronic integrated circuit 1.

Moreover, a passivation layer 7, of insulating material, extends on the metallization layer 6; contact pads 8 are opened in the passivation layer 7, are electrically connected to the metallization layer 6 and are designed to be electrically contacted from the outside. The outer surface of the passivation layer, designated by 7a, is a front outer face of the wafer 2.

In particular, in the substrate 3 the electronic components 4 are provided through appropriate processes designated as a whole by FEOL (Front End of Line), whereas the remaining electrical-insulation layers 5, metallization layers 6 that provide the electrical connections towards the outside, and the passivation layer 7 are designated as a whole by BEOL (Back End of Line).

Moreover one or more through vias are formed inside the wafer 2, designated as a whole by 10, including conductive interconnections that extend vertically through the substrate 3 and possibly traverse one or more of the electrical-insulation and metallization layers 5, 6, so as to define electrical connections between the electronic components 4, the metallization layers 6, or the contact pads 8, towards the back of the substrate 3. In particular, by way of example, FIG. 1 shows a first through via 10', which extends from the front surface 3a towards the back of the substrate 3, being designed to contact a region of an electronic component 4 (for example, a region of a MOSFET); a second through via 10'', which extends from a metallization layer 6 towards the back of the substrate 3; and a third through via 10''', which extends from the outer surface 7a of the passivation layer 7 towards the back of the substrate 3, being designed to contact a contact pad 8.

It is noted that, after their formation, the through vias 10 are generally insulated and "embedded" within the substrate 3 of the wafer 2, being separated from the back surface 3b of the substrate 3 by a portion of material having a given thickness.

For example, the through vias 10 may be obtained as described in United States Patent Applicant Publication No. 2005/0101054, or in "Wafer Level 3-D ICs Process Technology", of Chuan Seng Tan, Ronald J. Gutmann and L. Rafael Reif, pp. 85-95, Springer-Verlag New York Inc., which are incorporated by reference.

FIG. 2 shows the electronic integrated circuit 1 at the end of the manufacturing process: a final step of thinning the back of the substrate 3 (with known techniques of lapping, or "back grinding") exposes a portion of the back end of the through vias 10, which may in this way be contacted electrically from outside. Following upon the thinning process, the substrate 3 has a reduced thickness, for example even of less than 50 μm.

In one of the possible assembly processes, the wafer 2 is next diced so as to define a plurality of chips, each of which contains a respective electronic integrated circuit.

At the end of the manufacturing process, the through vias 10 thus traverse the entire substrate 3, providing a direct electrical connection from the electronic components 4 to the metallization layers 6 within the chip, or to the contact pads 8 from the back surface 3b of the substrate 3 (which in this case forms an outer back face of the chip), or more in general one or more electrical connections from the so-called "top" (i.e., the front part) of the chip, to the so-called "bottom" (i.e., the back part) of the chip.

The use of the through vias 10 may particularly advantageous for providing three-dimensional packaging structures for the electronic integrated circuits (the so-called "3D-packaging techniques"), which have been recently proposed in the field of semiconductors in general and of microelectromechanical systems (MEMS) in particular.

It is noted that, in a way that is usual in this sector of the art, the term "package" is here used for designating, as a whole, the casing, or covering structure, which surrounds, totally or partially, the chip or chips of semiconductor material of the electronic integrated circuit, enabling electrical connection thereof with the outside (for example, connection to a printed circuit of a corresponding external electronic system).

In a known way, 3D-packaging techniques envisage alternatively: vertical stacking of two or more packages, each enclosing one or more electronic integrated circuits (the so-called "package-level 3D packaging"); vertical stacking of two or more chips or dice (the so-called "chip-level 3D packaging"); and vertical stacking of two or more wafers (the so-called "wafer-level 3D packaging"). In particular, in the latter case, the wafers are stacked on one another and then diced before they are enclosed within a corresponding package. Clearly, to be able to provide the electrical connections between the electronic integrated circuits in the various wafers appropriately arranged through vias may be required.

The use of three-dimensional structures enables an increase in the density of the interconnections, at the same time reducing the length thereof, thus reducing also the parasitic effects; it may thus be possible to increase their performances. The use of through vias may thus be advantageous in a wide range of applications, in particular for reducing the length of the connections between the various chips, dice, or wafers.

The above use entails, however, various problems of production, linked, for example, to the etching processes required for forming vias/trenches having a small diameter (even of less than approximately 10 μm) and a large depth within the chip, or to the alignment processes between the wafers, chips, or dice. Also in the light of the critical aspects of the production process, and given the nature of electrical interconnection performed by the through vias, it would be advantageous to be able to verify proper operation thereof (for example before manufacturing the integrated circuits and in particular before completing dicing of the wafer of semiconductor material), and in particular to verify the resistance of the path offered to the electric current circulating through the through vias and moreover verify the presence of possible leakages and parasitic phenomena, for example, in regard to the substrate.

In this regard, so-called "automatic test equipment" (ATE) are known, which perform an automatic procedure of testing and electrical sorting the various chips within a wafer of semiconductor material (before the corresponding dicing) so as to select the chips operating properly for their subsequent packaging. This operation is known as "electrical wafer sort" (EWS) or "wafer sort" (WS) and envisages execution of appropriate electrical tests on the electronic integrated circuits in the various chips.

As shown schematically in FIG. 3, a testing apparatus, designated as a whole by 15, designed to test the electrical characteristics of a wafer, once again designated by the reference number 2, as in FIGS. 1 and 2, comprises a chuck 16 (incorporated in an electromechanical apparatus referred to as "prober", not illustrated herein), on which the wafer 2 to be tested is arranged, and a probe head 17, which is provided with a plurality of probes 18 (in a high number, ranging from several hundreds to several thousands) and can be actuated so as to approach the front face 7a of the wafer 2, thereby the probes 18 electrically contact the contact pads (not illustrated herein) of the wafer 2 in an appropriate way. To this end, the probe head 17 is coupled to a printed-circuit board 19, containing appropriate electronic circuits interconnected to an ATE (not illustrated herein), and to an electromechanical actuation system (not illustrated herein either). In use, the probe head 17, via the probes 18, may be electrically coupled with the electronic integrated circuits contained in the wafer 2 so as to measure one or more electrical parameters thereof. The ensemble of the probe head 17, of the probes 18, and of the printed-circuit board 19 constitutes a so-called "probe card".

The testing apparatus 15 may, however, be inadequate for testing the through vias 10 at the level of the wafer of semiconductor material. In fact, the through vias 10 have terminations that are electrically insulated from, and embedded within, the substrate 3, being thus inaccessible for the probe head 17 and the corresponding probes 18. An altogether similar consideration applies to testing of through vias 10 in a stacked structure of a three-dimensional type.

In addition, the use of the probes may prove incompatible for testing through vias (also when the test is carried out after thinning the substrate, i.e., with a back portion of the through vias accessible from the back of the substrate itself). In fact, the tendency is known to progressively reduce the dimensions of the through vias, which can have dimensions of even less than approximately 10 μm; this reduction of the dimensions may render it very difficult to obtain a reliable electrical contact between the tip of the probe and the through via, since the typical size of the surface of the tip of the probe is 10 µm-15 µm greater than a corresponding dimension of the through via (also on the basis of the requirements of the test current that is to flow through the contact).

The direct contact between the probes 18 and the through vias 10 may thus damage the surface of the through vias 10, with consequent problems of loss of electrical efficiency of the interconnections in the three-dimensional stacked structures. The same problem may also arise when a conductive element (for example a bump) is formed on the through vias to obtain an electrical connection between two chips in the three-dimensional structure. In fact, in any case, the reduction of the area of contact between the probe 18 and the through vias 10 (also due to the morphology of the two surfaces in contact and to the presence on these surfaces of other non-conductive materials, such as, for example, contaminating particles, etc.) may cause an increase of the electrical resistance of the contact, overheating the contact area and locally raising the temperature even by some hundreds of degrees centigrade, upon the passage of the electrical test current.

The circumstances listed hereinafter may render still more problematical the electrical contact between the probes and the through vias: certain testing equipment is provided with probes that run on the surface of the contact pads for improving the performance of the electrical contact; the probes are not always well aligned to one another and do not maintain their centering over time; moreover, there may occur imprecise alignment between the probes and the wafer, after the operations of positioning of the chuck that carries the wafer on which the test operations are to be carried out.

In addition, when the electronic integrated circuit to be tested has a high density of through vias, it may also happen that the distance between the through vias is smaller than the minimum distance possible between two probes (due to the technology of production, for example, 50 µm), thus rendering impractical or impossible the provision of a system of a traditional type for testing the through vias.

It follows that there does not exist up to now a solution that enables electrical testing of through vias, in particular in three-dimensional structures that envisage vertical stacking of two or more wafers or chips, and in particular there does not so far exist a testing technology that is scalable with the reduction of the dimensions of the through vias, i.e., such that it is possible to reduce the dimensions of the probes by the same factor with which the dimensions of the through vias are reduced.

SUMMARY

An embodiment is a system for testing through vias in a silicon substrate, which enables an either total or partial solution of the problems highlighted above.

In an embodiment, an apparatus comprises: a substrate, comprising: a first semiconductor layer having a first top surface and a first bottom surface; an insulating layer having a top surface and a bottom surface, wherein the top surface of the insulating layer is in contact with the first bottom surface; and a second semiconductor layer having a second top surface and a second bottom surface, wherein the second top surface is in contact with the bottom surface of the insulating layer; a first tubular column of insulating material extending in said substrate through the first semiconductor layer and through the insulating layer and into the second semiconductor layer to a depth that does not reach the second bottom surface; and a first conductive material disposed within the first tubular column of insulating material, said first conductive material having a bottom surface in contact with the second semiconductor layer.

In an embodiment, an apparatus comprises: a first semiconductor layer having a first top surface and a first bottom surface, said first semiconductor layer doped with a first conductivity type; a first tubular column of insulating material extending into said first semiconductor substrate layer to a first depth that does not reach the first bottom surface; a second tubular column of insulating material extending into said first semiconductor substrate layer to a second depth that does not reach the first bottom surface; a region of the first semiconductor layer doped with a second conductivity type that is located at a bottom of the second tubular column of insulating material; a first conductive material within the first tubular column of insulating material and in contact with the first semiconductor layer; and a second conductive material within the second tubular column of insulating material and in contact with the region of the first semiconductor layer doped with the second conductivity type.

In an embodiment, an apparatus comprises: a first semiconductor layer of a first conductivity type having a first top surface and a first bottom surface; a first tubular column of insulating material extending into said first semiconductor layer to a depth that does not reach the first bottom surface; and a first metal material that completely fills within the first tubular column of insulating material, said first metal material having a bottom surface in contact with the first semiconductor layer.

BRIEF DESCRIPTION OF THE DRAWINGS

For a better understanding of the present disclosure, one or more embodiments are now described, purely by way of non-limiting example and with reference to the attached drawings, wherein:

FIGS. 16a and 16b show, respectively, a cross-section and a simplified top plan view of the wafer of semiconductor material, in a further variant embodiment;

FIGS. 17a and 17b show, respectively, a cross-section and a simplified top plan view of the wafer of semiconductor material, in yet a further variant embodiment;

FIGS. 18, 20, and 22 show circuit block diagrams of the interface stage of the test circuit, according to further embodiments;

FIGS. 19 and 21 show sections through the wafer of semiconductor material, in variant embodiments;

FIG. 23 is a cross-section of the wafer of semiconductor material, at the end of a step of thinning of a corresponding substrate;

DETAILED DESCRIPTION

As will be discussed in detail hereinafter, an embodiment envisages, for carrying out electrical testing of at least one through via integrated within a wafer (or chip), integration of an appropriate electric/electronic test circuit within the wafer (or chip) accommodating the through via to be tested. The presence of this test circuit, designed to interface with an external testing apparatus (for example comprising an ATE), enables the testing apparatus to evaluate proper operation of the through via, enabling execution of at least one electrical test such as to measure at least one electrical parameter associated with the through via.

Figure 1:
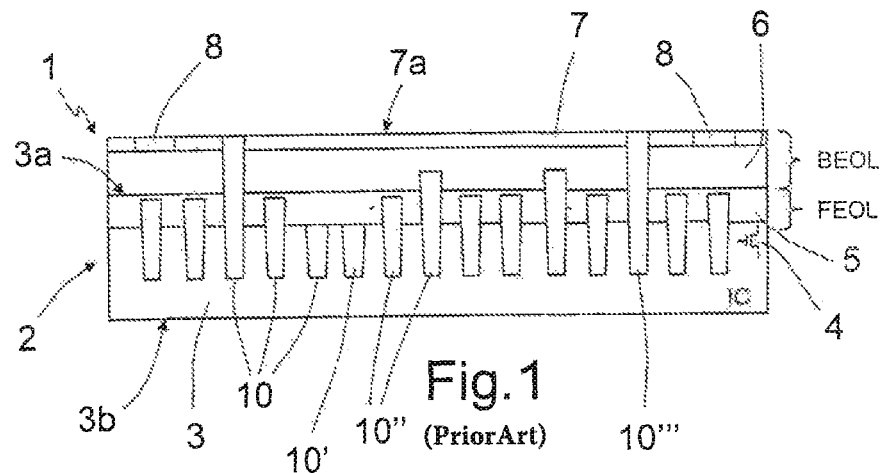
FIG. 1 is a schematic cross-section of a wafer of semiconductor material of a known type, in which through vias are provided, during a corresponding manufacturing process.
Figure 2:
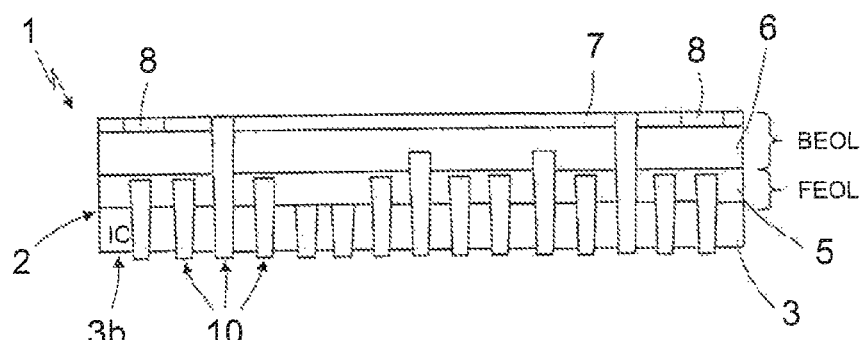
FIG. 2 is a schematic cross-section of the wafer of FIG. 1, at the end of the manufacturing process.
Figure 3:
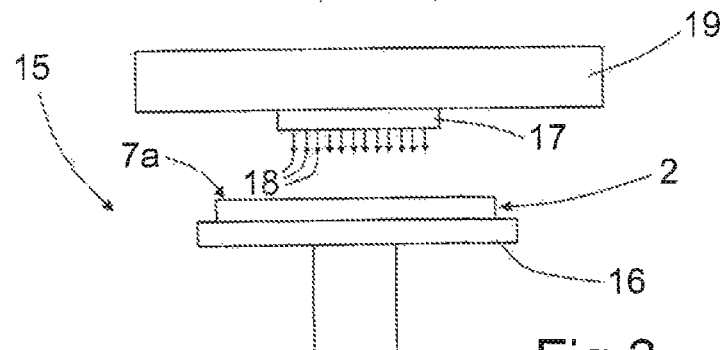
FIG. 3 is a schematic illustration of part of a testing apparatus of a known type, for electrical testing of a wafer of semiconductor material.
Figure 4:
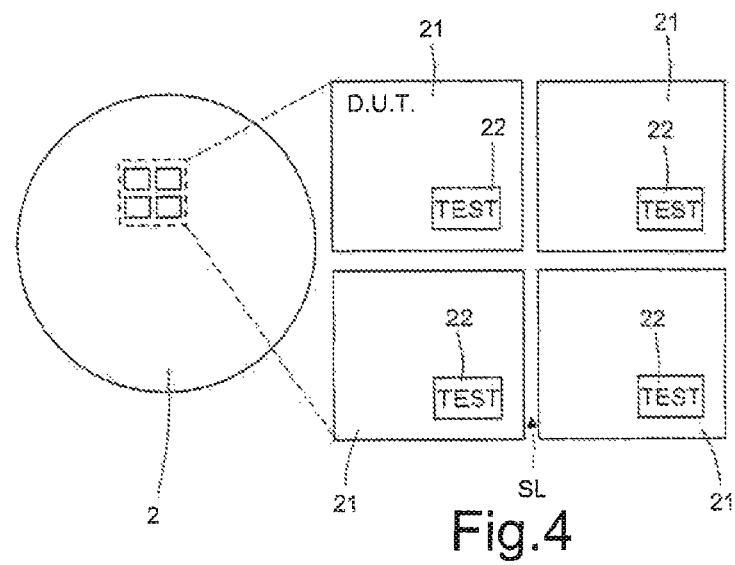
FIG. 4 is a schematic top plan view of a wafer of semiconductor material, containing a plurality of chips, according to an embodiment.
Figure 5:
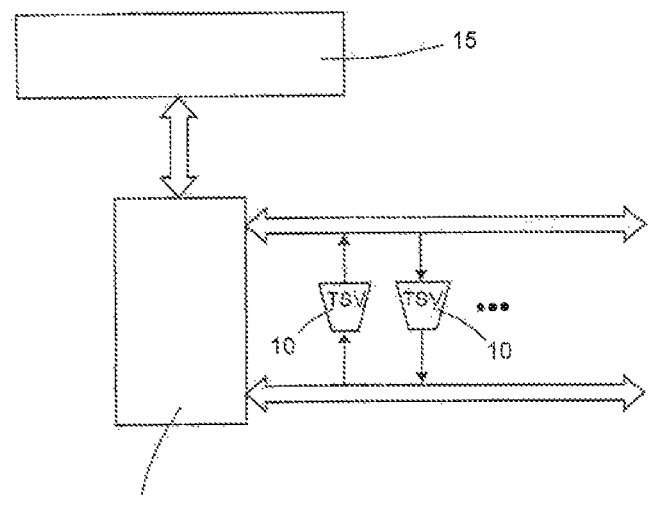
FIG. 5 is a schematic representation of the system for testing the through vias, according to an embodiment.

An embodiment schematized conceptually in FIGS. 4 and 5. FIG. 4 shows by way of example an enlarged portion of a wafer 2 of semiconductor material, in particular silicon, integrating a plurality of dice or chips 21, separated from one another, in a known way, by scribe lines, designated by SL. In each of the chips 21 a DUT—Device Under Test—is provided, i.e., an electronic integrated circuit designed to perform a desired function and comprising for its electrical interconnection at least one through via (not illustrated in FIG. 4). In order to carry out testing of the through vias, a test circuit 22 (so-called BIST—Built-In Self Test in the case in which it conducts the test automatically) is integrated within each chip 21 and may be obtained with the same techniques and fabrication steps for forming the electronic integrated circuit in the same chip 21.

As schematically represented in FIG. 5, which refers to a single chip 21, the test circuit 22 is electrically coupled to the through vias, here designated once again by 10, within the chip 21, and is moreover configured so as to interface with an ATE, located in the testing apparatus 15, so as to enable the ATE to perform at least one appropriate electrical test on the through vias 10. As will be described hereinafter, the electrical test provides, for example, that an appropriate test current is made to flow through the through via 10 so as to evaluate the electrical resistance to the passage of the current offered by the through via 10. In addition, or as an alternative, the electrical test provides for measuring the electrical insulation of the through via 10 from the substrate accommodating it. It is to be noted that the test circuit 22 may be configured so as to enable electrical testing of a plurality of through vias 10 contained within the chip 21.

Figure 6:
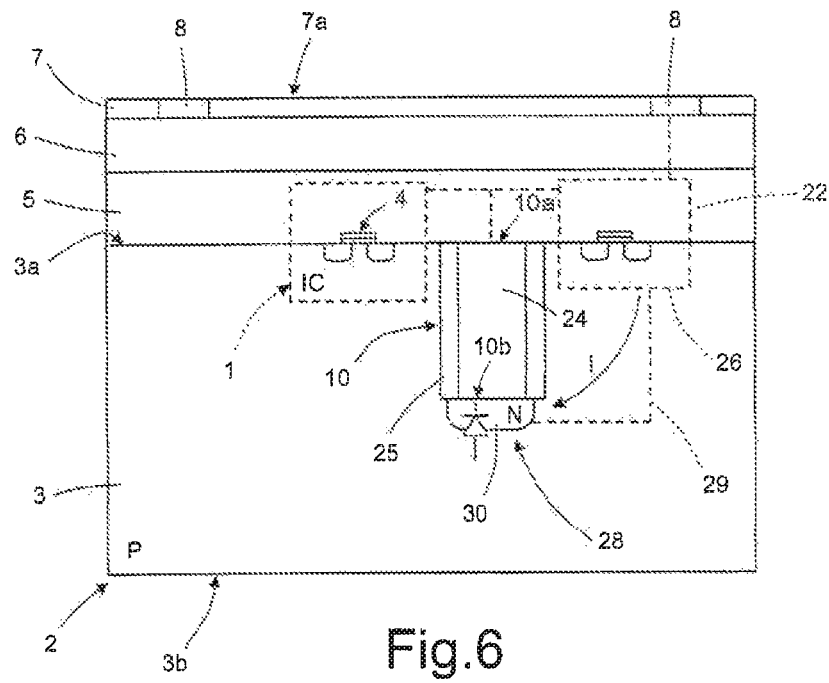
FIGS. 6 and 7 are schematic cross-sections of the wafer of FIG. 4, regarding a single chip containing at least one through via that is to undergo electrical testing.

In greater detail, FIG. 6 (in which elements that are similar to others already described previously are designated by the same reference numbers) shows a wafer 2 comprising: a substrate 3 of semiconductor material, in particular silicon, having a first doping type, for example, a P type doping; an insulation layer 5, arranged on the front surface 3a of the substrate 3; at least one metallization layer 6, arranged on the insulation layer 5; and a passivation layer 7, of insulating material, arranged on the metallization layer 6 and in which contact pads 8 are opened.

An electronic integrated circuit 1 is provided in a surface portion of the substrate 3 (for example by appropriate dopant implantations) and within the insulation layer 5 (by forming appropriate dielectric and/or conductive regions). By way of example, in FIG. 6 the electronic integrated circuit 1 comprises a MOS transistor, designated once again by 4.

The electronic integrated circuit 1 is moreover electrically coupled to a through via 10, provided within the wafer 2, and in particular through at least part of the substrate 3. The through via 10 has a surface end 10a, arranged at the front surface 3a of the substrate 3, and a back end 10b, embedded within the substrate 3, in a so-called "bulk region" thereof. In detail, the through via 10 is formed by a conductive region 24, for example, of metal material (such as copper) filling, surrounded laterally by an insulation region 25 (for example, of silicon oxide), so as to be laterally electrically insulated from the substrate 3.

Moreover, according to an embodiment, a test circuit 22 (of the BIST type, when it has characteristics such as to enable conduct of an automatic test inside the chip) is integrated within the wafer 2, comprising an interface stage 26 and a buried microelectronic structure 28.

The interface stage 26 is formed by appropriate circuit elements (by way of example a MOS transistor is shown in FIG. 6), integrated in the surface portion of the substrate 3 (similar to the electronic integrated circuit 1, for example exploiting process steps in common with the manufacture of the electronic integrated circuit 1), and is configured so as to be electrically coupled with one or more contact pads 8 accessible from outside, with the surface end 10a of the through via 10, and moreover so as to be electrically coupled, via an appropriate conductive path traversing the substrate 3, designated as a whole by 29, with the buried microelectronic structure 28. In particular, the interface stage 26 is electrically connected to the substrate 3 at a substrate terminal.

The buried microelectronic structure 28 is provided within the bulk region of the substrate 3 so as to be in contact with the back end 10b of the through via 10, and, in its simplest embodiment, is formed, for example, by a doped region 30, having an opposite doping type to the substrate 3, for example an N type doping. The doped region 30 (obtained, for example, as described in detail hereinafter) is arranged underneath the through via 10, entirely in contact with its conductive region 24, terminating laterally in contact with the insulation region 25. The doped region 30 consequently forms with the substrate 3 a PN semiconductor junction, i.e., a semiconductor diode (as shown schematically in FIG. 6), having an anode terminal formed by the substrate 3 and a cathode terminal formed by the doped region 30, electrically in contact with the back end 10b of the through via 10.

In use, the presence of the test circuit 22 within the wafer 2, accessible from outside via one or more of the contact pads 8, enables electrical testing of the through via 10 to be carried out, for example, by circulating a test current I through the interface stage 26, the conductive path 29 in the substrate 3, the buried microelectronic structure 28, the through via 10, and again through the interface stage 26 towards the contact pads 8. It is noted that the semiconductor diode formed by the junction between the doped region 30 and the substrate 3 is here directly biased so as to enable passage of the test current I through the through via 10. It is thus possible to evaluate, using a testing apparatus connected to the contact pads 8, the resistance offered by the through via 10 to the passage of the test current I. In particular, it is possible to measure, for example, a resistance of a differential type causing the test current I to assume two different values and measuring the two corresponding differences of potential resulting from the passage of the test current I.

Figure 7:
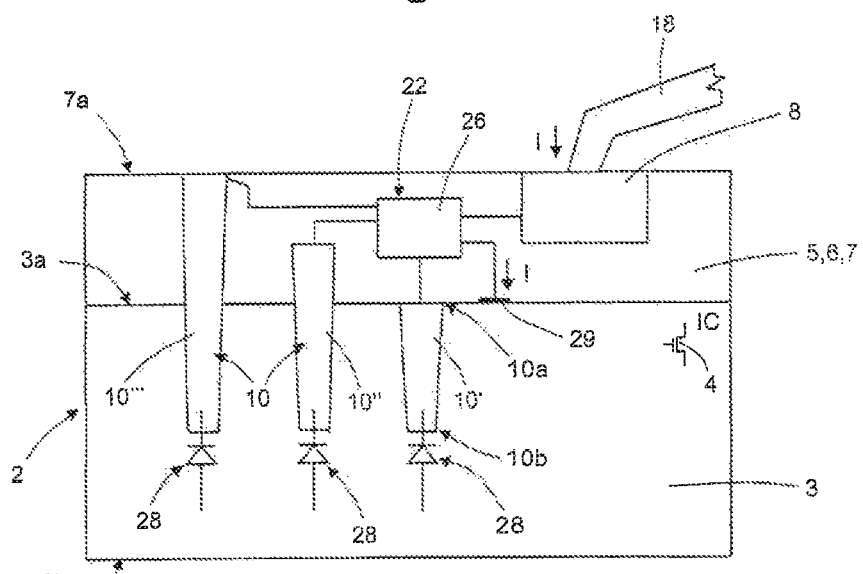

FIG. 7 summarizes in a schematic and simplified way the testing system implemented according to an embodiment. In particular, FIG. 7 shows the wafer 2 comprising the substrate 3 and one or more layers (insulating or metallization layers) arranged on the top surface 3a of the substrate 3 (designated as a whole by 5, 6, 7). The test circuit 22 is electrically coupled to a plurality of through vias 10, and in particular to a first through via 10', which extends from the front surface 3a towards the back of the substrate 3; a second through via 10'', which extends from a metallization layer (not illustrated in detail here) towards the back of the substrate 3; and a third through via 10''', which extends from the outer surface 7a of the passivation layer (not illustrated in detail here) towards the back of the substrate 3.

The back end 10b of each of the through vias 10 is electrically insulated from the substrate 3 by a respective semiconductor diode. In fact, during normal operation of the chip, or during testing of at least one of its electronic integrated circuits, the generic diode is reversely biased (and thus ideally equivalent to the insulation region that, in through vias of a traditional type, electrically insulates the corresponding back end from the substrate). The test circuit 22 is moreover electrically coupled to one or more contact pads 8, which in turn may be electrically contacted from the outside by a testing apparatus, and in particular by a probe, once again designated by 18, of a corresponding probe card, through which the test current I may flow.

Figure 8:
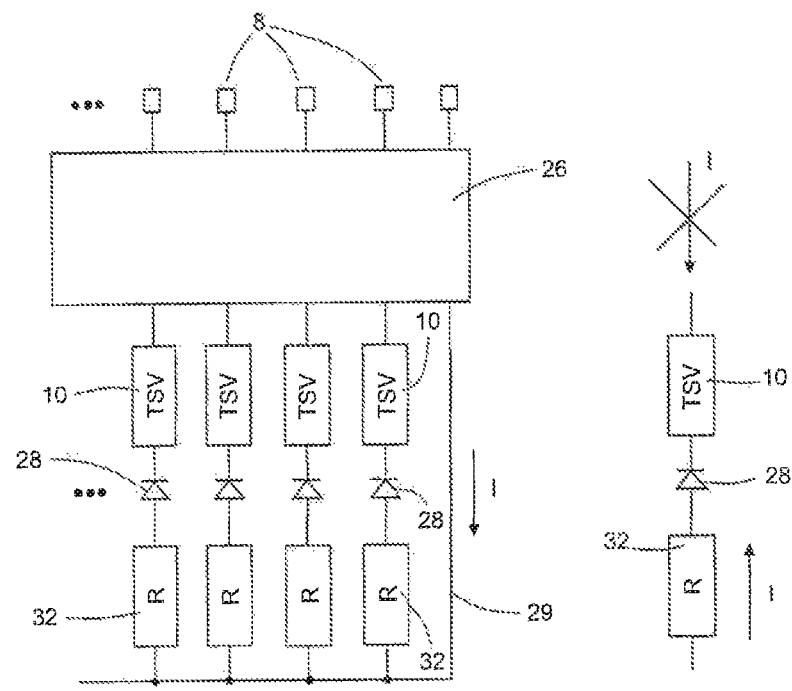
FIG. 8 is a circuit block diagram of a test circuit integrated in the wafer of semiconductor material.

The path of the test current I is also highlighted in FIG. 8, which shows, in particular, the test circuit 22 interfaced with a plurality of through vias 10 and of contact pads 8. A resistive element 32 indicates the resistance that the test current I encounters in the substrate 3. In this regard, the resistance of the resistive element 32 along the path of the test current I may be varied by approaching or moving away the substrate terminal (i.e., the area where the electrical connection between the interface stage 26 and the substrate 3 is provided) with respect to the through via 10 to be tested, or else by increasing the number of contact terminals for electrical coupling with the substrate, or once again by introducing a conductive layer, for example of metal material, underneath the back surface 3b of the substrate 3. In this case, a layer of insulating material, for example dielectric, may be provided on the bottom surface of the conductive layer, which is designed to come into contact with the chuck 16 of the testing apparatus 15 so as to prevent undesired leakage towards the chuck.

The presence of the semiconductor diode causes the through via 10 to be completely electrically insulated from the substrate 3 (the through via 10 is in fact insulated also laterally from the substrate 3 thanks to the insulation region 25 that surrounds the conductive region 24) so that little or no current flows from the through via 10 towards the substrate 3 (as indicated as a whole in the same FIG. 8), except for a possible reverse current through the diode (of a small amount, so that it may be considered negligible, at least to a first approximation). Consequently, also the electronic integrated circuit 1, connected to the through via 10, is electrically insulated from the substrate 3 both during normal operation and during the operation of electrical testing of at least part of the electronic integrated circuit 1. Thus a reduction is obtained of the parasitic couplings of the test circuit 22 and of the electronic integrated circuit 1 with the substrate 3, and in a risk of making erroneous measurements, due to the structural modification of the through vias 10, during the testing steps.

Figure 9:
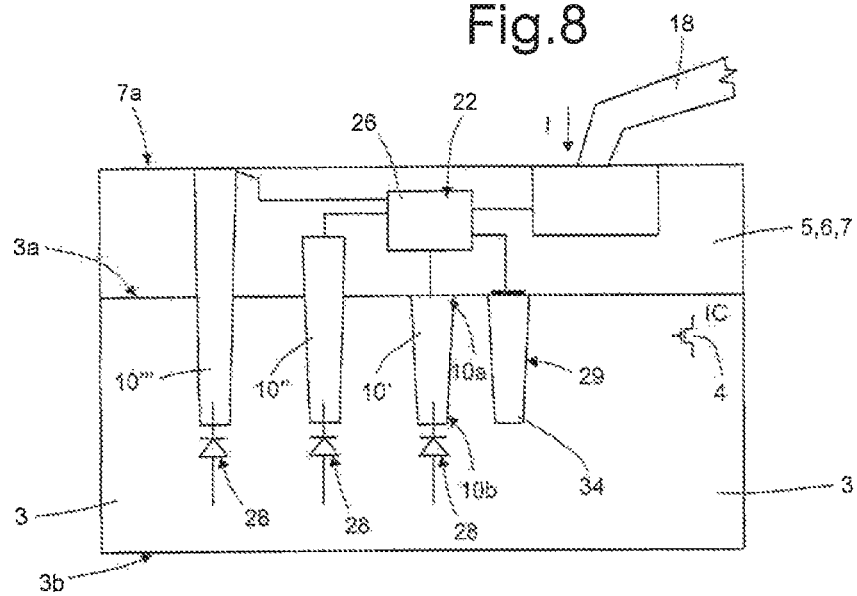
FIG. 9 is a schematic cross-section of the wafer of FIG. 4, according to an embodiment.

As illustrated in FIG. 9, the conductive path 29 between the interface stage 26 of the test circuit 22 and the through vias 10, through the substrate 3, may comprise at least one through interconnection, designated by 34, for example, of metal material (such as copper) filling, at least partially electrically insulated from the substrate 3 (in particular, as will be shown hereinafter, having a respective conductive region in direct contact with the substrate 3 in an area corresponding to a back end).

Figure 10:
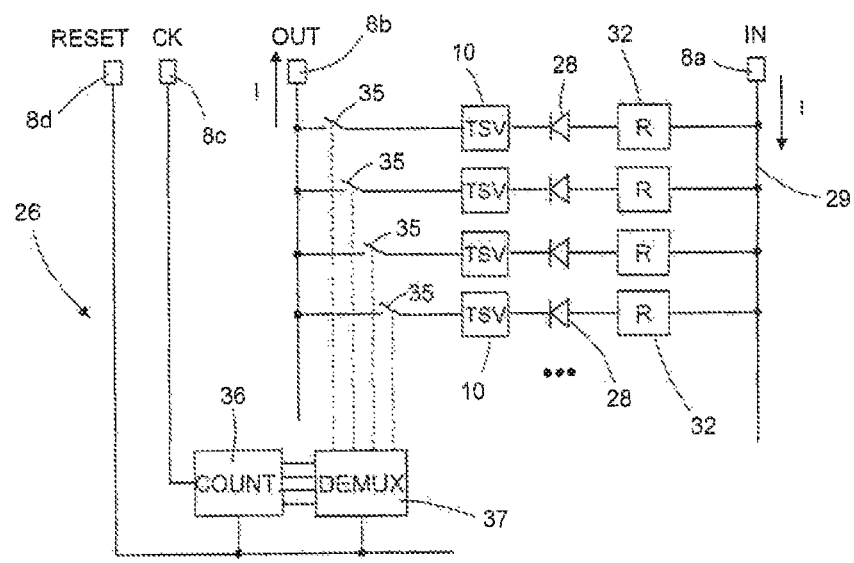
FIG. 10 is a circuit block diagram of an interface stage of the test circuit, according to an embodiment.
Figure 11A:
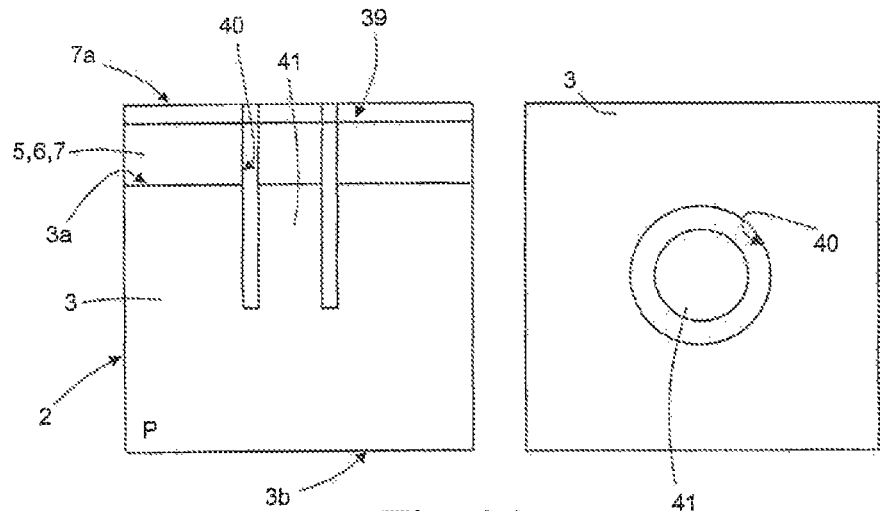
FIGS. 11a-11e are sections through the wafer of semiconductor material, in successive steps of the process for manufacturing a through via, which is appropriately modified to carry out testing thereof.
Figure 11B:
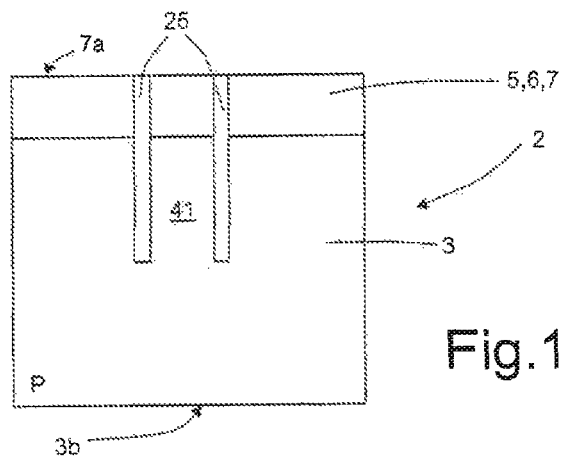
Figure 11C:
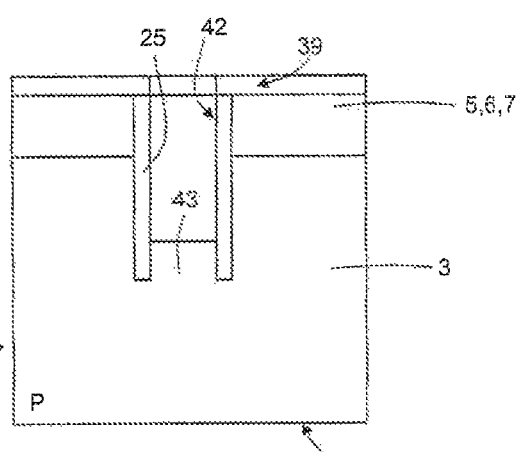
Figure 11D:
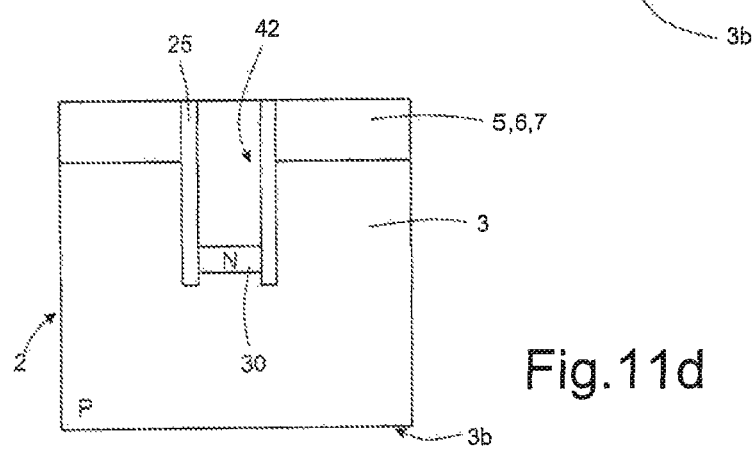
Figure 11E:
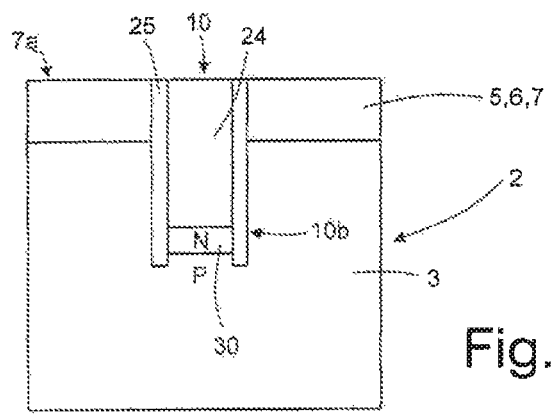

FIG. 10 shows a possible circuit embodiment of the interface stage 26 of the test circuit 22.

The interface stage 26 is coupled to four terminals, which may be, for example, connected to contact pads 8 and in particular to: an input pad 8a, designed to receive a test current I from an appropriate testing apparatus (not illustrated herein); an output pad 8b, designed to be connected to the testing apparatus so as to close the path for the test current I; and a clock pad 8c and a reset pad 8d, which are respectively designed to receive a synchronism signal CK and a reset signal from the testing apparatus.

The interface stage 26 comprises: a plurality of first electronic switches 35, for example implemented by MOS transistors, each of which is arranged between the front end 10a of a respective through via 10 and the output pad 8b; a counter 36, connected to the clock pad 8c and receiving the synchronism signal CK; and a demultiplexer 37, having inputs connected to the count outputs of the counter 36, and a plurality of outputs, each connected to a specific electronic switch 35, to which it supplies a control signal. Both the counter 36 and the demultiplexer 37 have an input connected to the reset pad 8d, from which they receive the reset signal.

In use, the operation of testing the through vias 10 is enabled by supplying the synchronism signal CK to the clock pad 8c so that the counter 36 modifies its output at each pulse of the synchronism signal CK. Consequently, the output of the demultiplexer 37 cyclically activates, as a function of the inputted count signal, a different electronic switch 35, enabling passage of the test current I from the input pad 8a to the output pad 8b, passing through the substrate 3, the doped region 30 (and the corresponding semiconductor diode) and the respective through via 10, and thus enabling testing of the through via 10 (for example, evaluating the electrical resistance that the through via 10 offers to the passage of the test current I). The reset signal enables the circuit to be brought back into the initial operating condition, with all the first electronic switches 35 in the open state, for testing once again the through vias 10. Appropriate circuits for driving the electronic switches 35 may possibly be present, connected to the outputs of the demultiplexer 37.

In particular, the four contact pads 8 may be in this way connected to a testing apparatus, and enable the testing apparatus to conduct electrical tests of the through vias 10 and validate their proper operation on the basis of the value of the measured current, highlighting any possible defects or faults that may be present.

The test circuit 22 may be more complex than the one illustrated, and comprises for example a possibly programmable finite-state machine, logic circuits, controllers, memories, processors, circuits for measurement and generation of signals, testing interfaces, whether wired or wireless, and units for processing data and signals. Two synchronism signals CK may moreover be used, for implementing an up count or a down count. In addition, two or more chips may have in common at least one pad, such as the reset pad 8*d*, for example positioned in the scribe-line region.

With reference now to FIGS. 11*a*-11*e* an embodiment of a method is described for forming a through via 10 within the wafer 2, and simultaneously within the buried microelectronic structure 28, i.e., in this embodiment, within the doped region 30 in contact with the back end 10*b* of the through via 10, for forming the semiconductor diode.

The wafer 2 initially comprises the substrate 3 of semiconductor material, for example having a P type doping, and possibly one or more (insulating or conductive) surface layers arranged on the substrate 3, designated once again as a whole by 5, 6, 7.

Using a masking process (by forming a resist layer 39 for example on the front outer face 7*a* of the wafer 2 or the front surface 3*a* of the substrate 3) and an etching process, for example an anisotropic etch, a trench 40 is defined (FIG. 11*a*) and extends in a surface portion of the substrate 3, for a desired depth. For example, the trench 40 has, in plan view, the shape of a circular ring, delimiting a cylindrical portion 41 of the substrate 3.

Next (FIG. 11*b*), the trench 40 is filled with an insulating material, such as, for example, an oxide, a dielectric material, a polymer, via an appropriate process, for instance, a thermal oxidation process or a chemical vapour deposition (CVD). The insulating excess material is removed from the front outer face 7*a* (or front surface 3*a* of the substrate 3) of the wafer 2, for example by a chemical-mechanical planarization (CMP). At the end of the process, the insulation region 25 is formed within the trench 40 and forms part of the through via 10.

Next (FIG. 11*c*), via a further masking (by forming a further resist layer 39) and etching process, a surface part of the cylindrical portion 41 of the substrate 3 is removed within the insulation region 25, thus creating a hole 42, which is also of a cylindrical shape. In particular, the depth of the etch is such that a remaining portion 43 of the cylindrical portion 41 remains on the end of the hole 42 and is surrounded at the sides by the insulation region 25.

Next (FIG. 11*d*), the at least partial doping of the above remaining portion 43 is carried out, for example via high-temperature diffusion or via ion implantation followed by thermal annealing, to form the doped region 30, on the bottom of the hole 42, having an N type doping.

Next (FIG. 11*e*), the hole 42 is filled with a conductive material, such as for example copper or tungsten, using a CVD or an electroplating process, to form the conductive region 24 of the through via 10. In this step, deposition of a seed for growing the conductive material and/or a CMP process for removing the excess material on the front outer face 7*a* of the wafer 2 (or front surface 3*a* of the substrate 3) may be possibly required.

At the end of the process, a through via 10 of conductive material is thus provided, insulated from the substrate 3 laterally by the insulation region 25 and vertically by the PN junction formed between the doped region 30 and the substrate 3. In particular, the through via 10 is connected in series to a semiconductor diode (formed by the junction between the doped region 30 and the substrate 3), arranged in direct contact with its back end 10*b* in the substrate 3.

In this step of the process, the electronic integrated circuit 1 may be provided in the surface portion of the substrate 3, using per se known techniques, possibly simultaneously with forming the interface stage 26 of the test circuit 22. In particular, the doped region 30 may be obtained by exploiting doping steps already envisaged for forming transistors (or other electrical components) of the electronic integrated circuit 1 or of the test circuit 22.

Figure 12:
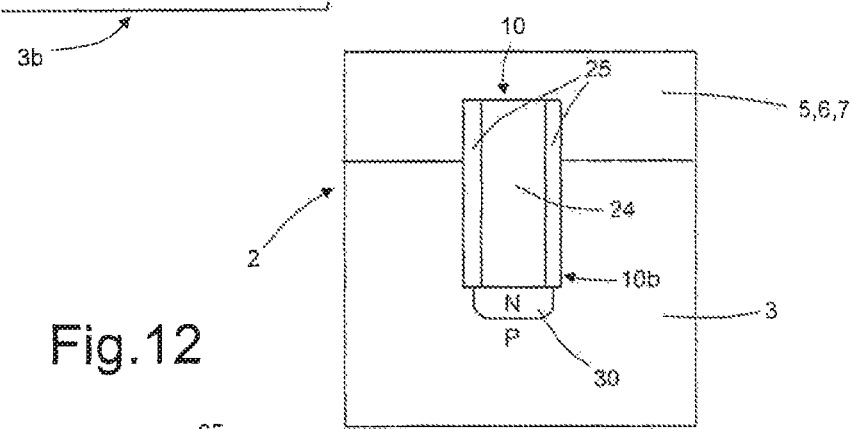
FIGS. 12-15 show cross-sections through the wafer of semiconductor material, according to different variant embodiments.

According to a variant of the process described (see FIG. 12), the etch that leads to forming the hole 42 may have a depth such as to entirely remove the cylindrical portion 41 so that the conductive region 24 that is subsequently formed within the hole 42 has a bottom surface approximately coplanar with that of the insulation region 25. In this case, the doped region 30 may not be laterally delimited by the insulation region 25, but may be arranged underneath and in contact with the back end 10*b* of the through via 10.

Further embodiments of the testing system are now described.

Figure 13:
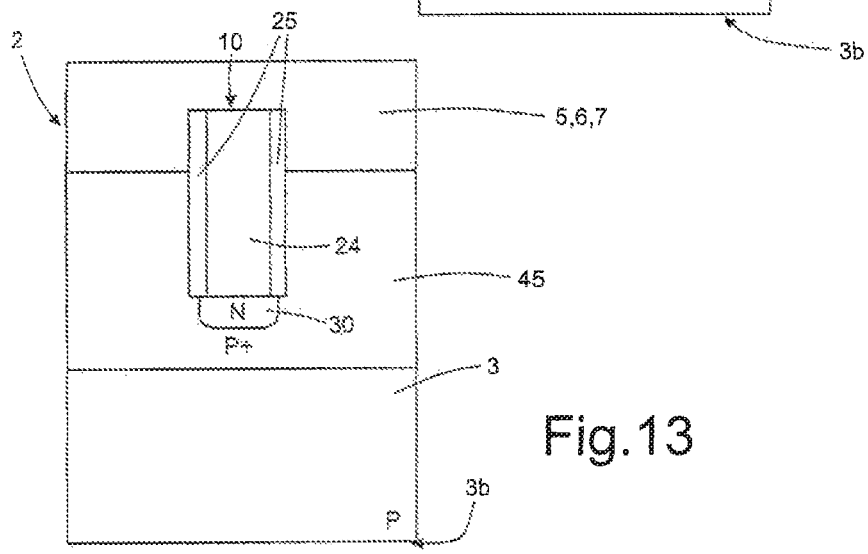

As shown in FIG. 13, the doped region 30 (and the corresponding semiconductor diode) may be formed within an active layer 45, epitaxially grown on the substrate 3 and having for example a $P^+$ type doping; it may be noted that, in this case, the possible surface layers 5, 6, 7 of the wafer 2 are formed on the active layer 45.

Figure 14:
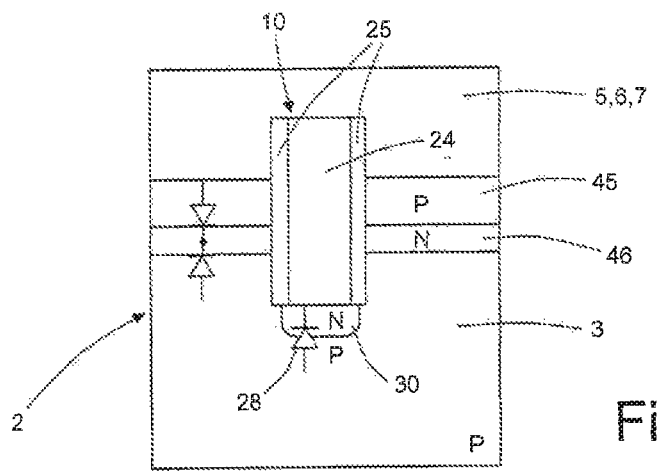

Alternatively, and as shown in FIG. 14, on the substrate 3, two epitaxial layers are formed, namely, an intermediate epitaxial layer 46, having an opposite doping to the substrate 3 (in the example of an N type), and a second epitaxial layer, which forms the active layer 45, laid on the intermediate epitaxial layer 46, and having a P type doping. The doped region 30 is in this case formed, in a way similar to what described previously, within the substrate 3.

The two epitaxial layers 45, 46 form two opposed semiconductor diodes (shown schematically in FIG. 14), which prevent the passage of current (in both directions) during testing of the through vias 10. In this way, the effect of possible parasitic paths between the electronic integrated circuit 1 (here not illustrated) and the substrate 3, which could alter the test measurements, is approximately eliminated. In fact, the single path for the test current I occurs in this case through the substrate 3, the semiconductor junction directly biased formed by the doped region 30, and the through via 10. Instead, the test current I typically cannot reach the substrate 3 through parasitic paths between the substrate 3 and the test circuit 22 or the electronic integrated circuit 1.

The conductive path 29 between the interface stage 26 of the test circuit 22 and the substrate 3 comprises here at least one through interconnection 34 that traverses the epitaxial layers 45, 46 (being laterally insulated from the epitaxial layers 45 and 46), reaches the substrate 3 and contacts it electrically, for example via a direct contact between the corresponding conductive region and the substrate 3. As an alternative, in a way not illustrated, the electrical contact between the through interconnection 34 and the substrate 3 may be improved by providing a doped region (in a way altogether similar to the doped region 30) in contact with the back end of the through interconnection 34, which has the same doping type as the substrate 3 (with a higher concentration).

As an alternative, to achieve a similar effect of insulating the substrate 3 against possible parasitic couplings, it may be possible, starting from the substrate 3, to provide a doped surface layer having an opposite type doping (of an N type) with respect to the substrate 3, and then to form an epitaxial layer of an opposite type (of a P type) on the doped surface layer (which is to form the active layer 45). Alternatively, starting from the substrate 3, it may be possible to provide an epitaxial layer with an opposite type doping (of an N type) with respect to the substrate 3, and then to dope a surface portion of the epitaxial layer with an opposite type doping (of a P type) to form the active layer 45; as further alternative, it may be possible to dope a surface portion of the substrate 3 first with dopants of an opposite type (N type) with respect to the substrate 3, and then with an opposite type (P type) with respect to the previous doping.

In any case, the resulting structure provides for PN junctions arranged between the surface layers where the integrated circuits are to be provided (in particular, the electronic integrated circuit 1 and the test circuit 22) and the substrate 3. In practice, a bipolar junction transistor (BJT) of a PNP type is formed vertically with respect to the wafer 2. In this case, a PNP composite substrate could be said to be present within the wafer 2, a first layer whereof (the substrate 3) is used for testing the through vias 10, and a second layer (the active layer 45) is used for forming the integrated circuits.

The electronic integrated circuit 1 and the interface stage 26 of the test circuit 22 may here be formed in the surface layer of semiconductor material (the active layer 45, having a P doping), and are insulated from the substrate 3 by the underlying intermediate epitaxial layer 46, with a doping of opposite conductivity, i.e., of an N type. In an altogether evident way, via appropriate microelectronic structures (for example doped regions that extend vertically, or further through vias not totally insulated), it is possible to access the non-surface layers of the PNP composite substrate, for example, by accessing the N doped region.

Figure 15:
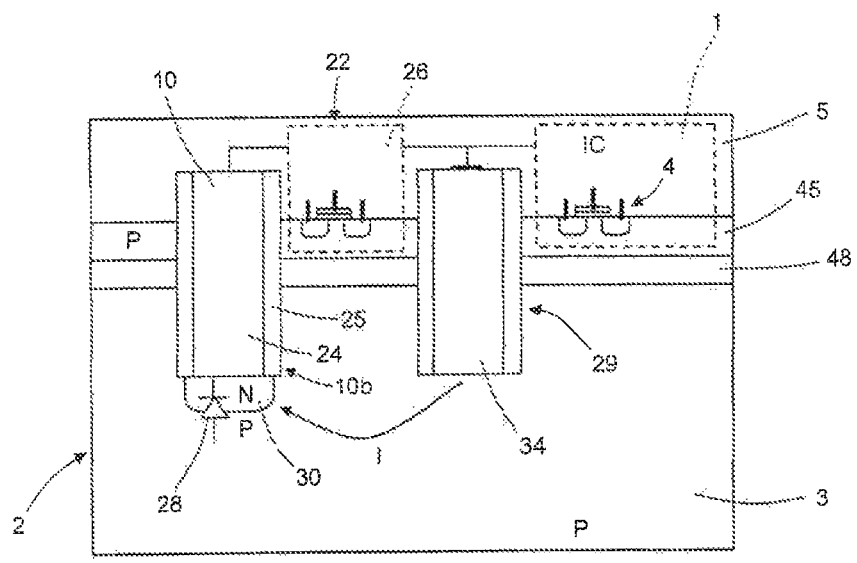

As alternative embodiment to reduce or eliminate the parasitic effects due to undesired couplings between the substrate 3 and the test circuit 22 or the electronic integrated circuit 1, it is possible to use a silicon-on-insulator (SOI) substrate, as shown in FIG. 15. In this case, the substrate 3 forms the buried layer of the SOI substrate, separated by a dielectric layer 48 from the active layer (or surface layer) 45 of the SOI substrate. The electronic integrated circuit 1 and the test circuit 22 are provided within the active layer 45, being in this way electrically insulated from the substrate 3 by virtue of the composite structure of the SOI substrate.

The structures previously described may be modified by reversing the doping type of the various layers, from N type to P type and vice versa (for example, starting from a substrate 3 having an N type conductivity, instead of a P type).

Moreover, the shape and the structure of the through vias 10 may vary with respect to the above.

For example (see FIGS. 16a-16b), at least one of the through vias 10 may have the shape of a cylindrical ring; in plan view (see FIG. 16b), the conductive region 24 and the insulation region 25 of the through via 10 have here the shape of concentric annuli. Also in this case, the doped region 30 in electrical contact with the conductive region 24 is in any case present at the back end 10b of the through via 10.

As shown in FIGS. 17a-17b, the through vias 10 may moreover have a coaxial structure (of a per se known type, and not described in detail herein), in case of radiofrequency (RF) applications, or the like. In this case, the conductive region 24 of the through via 10 (in contact underneath with the doped region 30) is surrounded by the insulation region 25, and moreover by a further conductive region designated by 24' (designed to be connected to ground), in turn surrounded by a further insulation region 25'.

Also the circuit structure of the interface stage 26 of the test circuit 22 may vary with respect to the above, for example, by the presence of a different configuration of the conductive path 29 through the substrate 3, of the through vias 10, and/or of the through interconnections 34.

Figure 18:
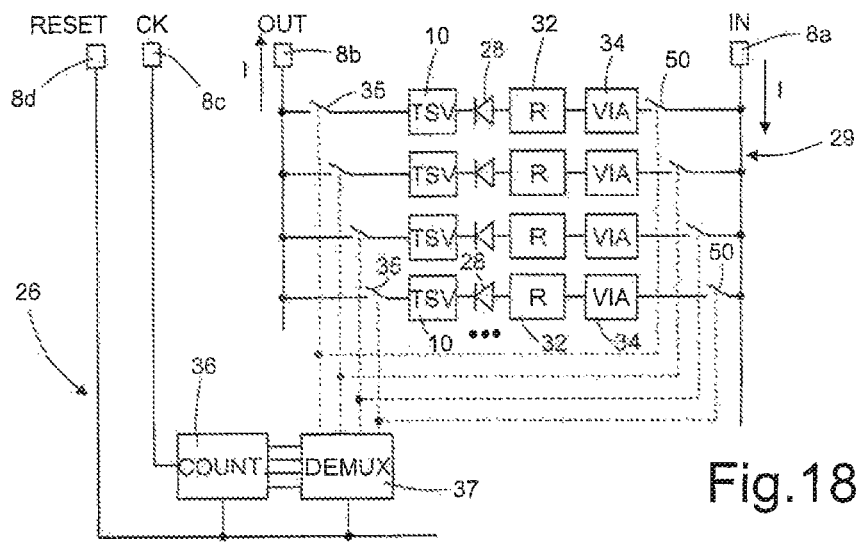

For example, FIG. 18 refers to a conductive path 29, which enables the interface stage 26 to reach the substrate 3 and the doped region 30, comprising a through interconnection 34 (designated simply by "via" in FIG. 18) for each through via 10 that is to be tested (this may, for example, be the case of the vias with coaxial structure of FIGS. 17a and 17b). In this case, the interface stage 26 comprises second electronic switches 50, one for each through interconnection 34, connected between the input pad 8a and the surface end of the respective through interconnection 34. The second electronic switches 50 have control inputs connected to the outputs of the demultiplexer 37, similarly to the first electronic switches 35 (thus enabling selective creation of a complete path for the test current I through the respective through via 10).

Figure 19:
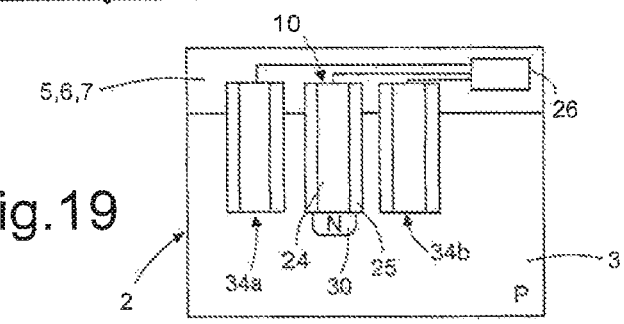
Figure 20:
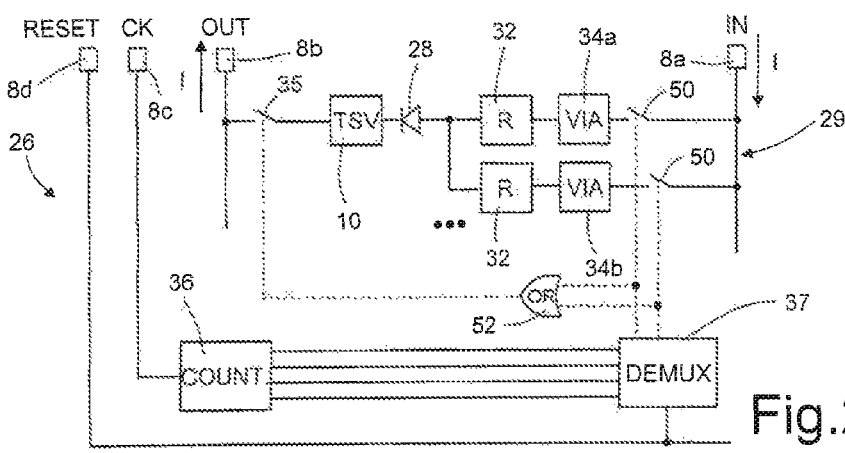

FIGS. 19 and 20 refer, instead, to the case where, for each through via 10 that is to undergo electrical testing, two or more through interconnections 34 are present, designated in FIG. 19 by 34a and 34b. In this case, as shown in FIG. 20, in the interface stage 26, the outputs of the demultiplexer 37 directly drive the second electronic switches 50, and moreover form the inputs of an OR logic gate 52, the output whereof drives the single (in this simplified case) first electronic switch 35. The first electronic switch 35, the through via 10, and the corresponding semiconductor diode are in fact arranged electrically in series to both the conductive paths formed by the through interconnections 34a and 34b, which are selectively activated in an alternative way by the demultiplexer 37, by activating the respective second electronic switch 50.

In a substantially similar way, FIGS. 21 and 22 refer to the case with two through vias 10', 10" that are to undergo electrical testing, and only one conductive path 29 (comprising a single through interconnection 34), common to both of the through vias 10', 10". In this case, the outputs of the demultiplexer 37 directly drive the first electronic switches 35, while the output of the OR logic gate 52, the inputs whereof are once again formed by the same outputs of the demultiplexer 37, drives the single (in this example) second electronic switch 50.

In a way common to all the various embodiments described previously, at the end of the manufacturing process, after possible electrical testing of the through vias 10 (and, in a traditional way, of the various electronic integrated circuits 1), and after subsequent identification of the dice (or chips) within the wafer 2 operating correctly (i.e., the so-called "good dice"), the wafer 2 (or the chips, if the step of dicing of the wafer 2 has already been performed) is subjected to a thinning process (for example, via lapping or mechanical back grinding), thus removing the back portion of the substrate 3 (starting from the corresponding back surface 3b) so that the back end 10b of the through vias 10 is accessible from the back of the wafer 2. Via an appropriate etching process, the back end 10b is possibly made to project with respect to the surface of the outer back face of the wafer 2, thus forming a conductive element (of the bump type) for connection to an external printed circuit, or to another chip or wafer in a three-dimensional stacked structure (alternatively, an appropriate conductive element may be coupled to the back end 10b of the through via 10).

It may be noted that the thinning process moreover entails removing the buried microelectronic structure 28 of the test circuit 22, and in particular the doped region 30 underneath the through via 10 (originally buried within the substrate 3) and consequent removing the semiconductor diode originally arranged in series with respect to the through via 10.

These operations, whether they be carried out on the single die (or chip) or at the level of the wafer 2 before its dicing, may damage the through vias 10, so that it may possibly be convenient to proceed to a further electrical test of the through vias 10, before proceeding to final assembly.

Therefore, and embodiment of, the test circuit 22 (even if at this point it is without the buried microelectronic structure 28) may be once again used for executing this further electrical test.

In detail, as shown in FIG. 23, the wafer 2, here appropriately thinned, i.e., having a substrate 3 with a reduced thickness and the through vias 10 appropriately accessible from the back, is coupled to a conductive test layer 54, for example formed by a conductive polymer where possibly further conductive particles (for example, metal particles) have been dispersed in order to reduce the electrical resistance thereof; in particular, the conductive test layer 54 is coupled to the back surface 3b of the substrate 3 so as to be arranged in contact with the back ends 10b of the through vias 10, electrically connecting them to one another. The conductive test layer 54 may coat in a uniform way the back surface 3b of the substrate 3, or alternatively be positioned so as not to connect all the through vias 10 to one another, but so as to create, for example, clusters of through vias 10 electrically connected to one another; in addition, the conductive test layer 54 may possibly be applied to the chuck of a testing apparatus (a corresponding probe 18 whereof is illustrated in FIG. 23), of a per se standard type, which is used for conducting the further electrical test of the through vias 10.

Figure 24:
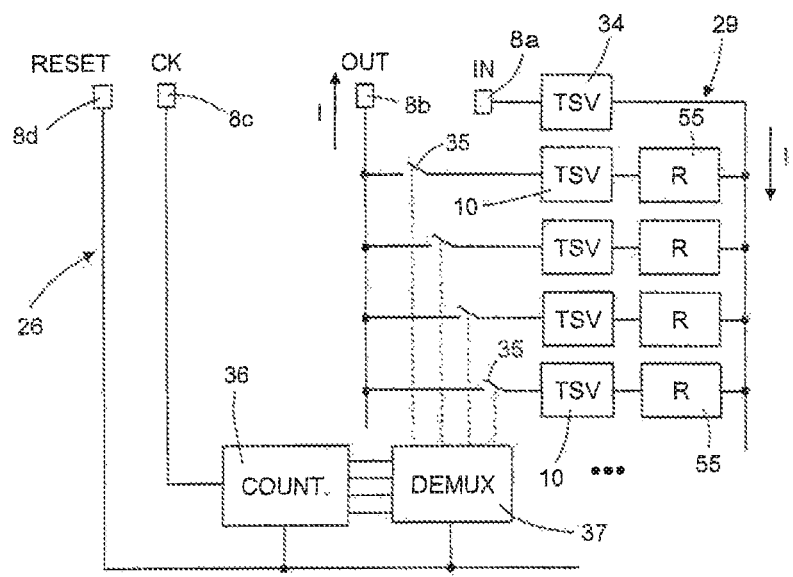
FIG. 24 is a circuit block diagram of the interface stage of the test circuit, integrated in the wafer of FIG. 23.

In this case (see also FIG. 24), with no semiconductor diodes arranged in series to the through vias 10, the path for the test current I closes thanks to the presence of parasitic electrical resistances, designated by 55, which originate from the conductive test layer 54. In particular, the test current I flows in this case from the input pad 8a through the substrate 3 by means of the through interconnection 34, and then flows through the through vias 10 that are to be tested via the corresponding parasitic electrical resistance 55.

It is noted that the structure and operation of the interface stage 26 of the test circuit 22 may remain unchanged with respect to the above, differing only as regards the mode with which the test current I reaches the back ends 10b of the through vias 10.

Once the further electrical test of the through vias 10 has been completed, separation (the so-called "debonding operation") of the conductive test layer 54 from the back surface 3b of the substrate 3 of the wafer 2 (or of the die, or chip) is carried out, removing any residue of the conductive substance. This is followed by final assembly and packaging.

According to further embodiment, one or more embodiments of the testing system and method described previously are used also for conducting electrical tests of the through vias 10 in a three-dimensional stacked structure formed by at least two dice (or chips), or wafers, stacked on one another, in a face-to-face way (i.e., with the corresponding external front faces in contact) or face-to-back way (i.e., with the front outer face of one chip in contact with the outer back face of the other chip), again using the test circuits 22 (provided substantially as described previously) in at least one of the chips (possibly without the corresponding buried microelectronic structures 28, in the case where the corresponding substrate 3 has already been thinned).

Embodiments of the testing methods that are now described may be used while forming both the three-dimensional stacked structure, and the final overall system within a package (the so-called system-in-package—SiP).

Figure 25:
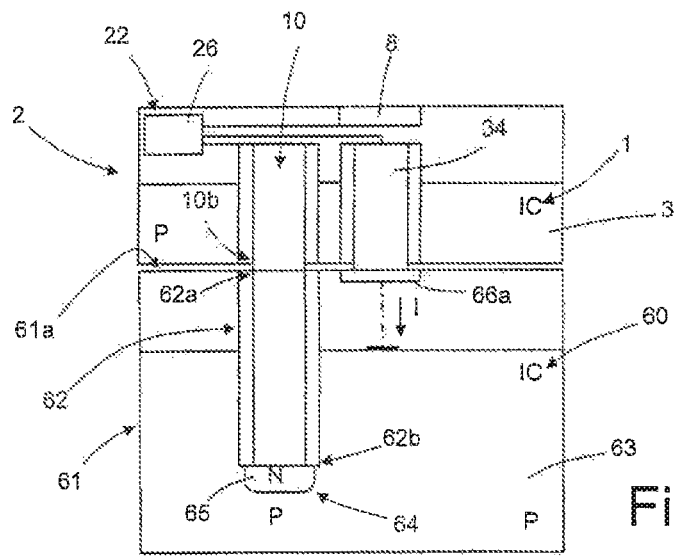
FIGS. 25, 27, and 30 show cross-sections through variant embodiments of three-dimensional stacked structures obtained by stacking two wafers of semiconductor material that integrate respective through vias.

In detail, FIG. 25 is a schematic illustration of a first example of a three-dimensional stacked structure, wherein a first electronic integrated circuit 1 formed in a first wafer (or, in an altogether equivalent way, a first chip) 2, already thinned, and comprising a first through via 10 that traverses a corresponding substrate 3 thereof, is arranged stacked on a second electronic integrated circuit, designated by 60, formed in a second wafer (or chip) 61, having a respective through via 62, buried within a corresponding substrate 63. It is emphasized that, even though reference is here made to wafers, it is to be understood that the same considerations may apply to the case of the chips obtained from dicing the wafers.

The first wafer 2 comprises a test circuit 22, and a corresponding interface stage 26 (the corresponding buried microelectronic structure 28 has been previously removed), connected to the first through via 10 and moreover to a through interconnection 34 that traverses the corresponding substrate 3. The second wafer 61 comprises a respective test circuit 64, equipped with a buried microelectronic structure (provided similarly to the above), and in particular with a doped region 65 arranged in contact with the back end 62b of the through via 62, buried within the substrate 63; the test circuit 64 does not comprise in this case a corresponding interface stage. Moreover contact pads are provided on the front surface 61a of the wafer 61.

The back end 10b of the through via 10 of the first electronic integrated circuit 1 directly contacts the top end 62a of the through via 62 of the second wafer 61, which is accessible from the front face 61a of the wafer 61. The through interconnection 34 of the first electronic integrated circuit 1, which is also accessible from the back of the substrate 3, electrically contacts the substrate 63 of the second wafer 61, as shown schematically in FIG. 25, through an input pad 66a (in a way not illustrated, a through interconnection may for the purpose be provided through one or more of the surface layers of the second wafer 61, towards the corresponding substrate 63).

Figure 26:
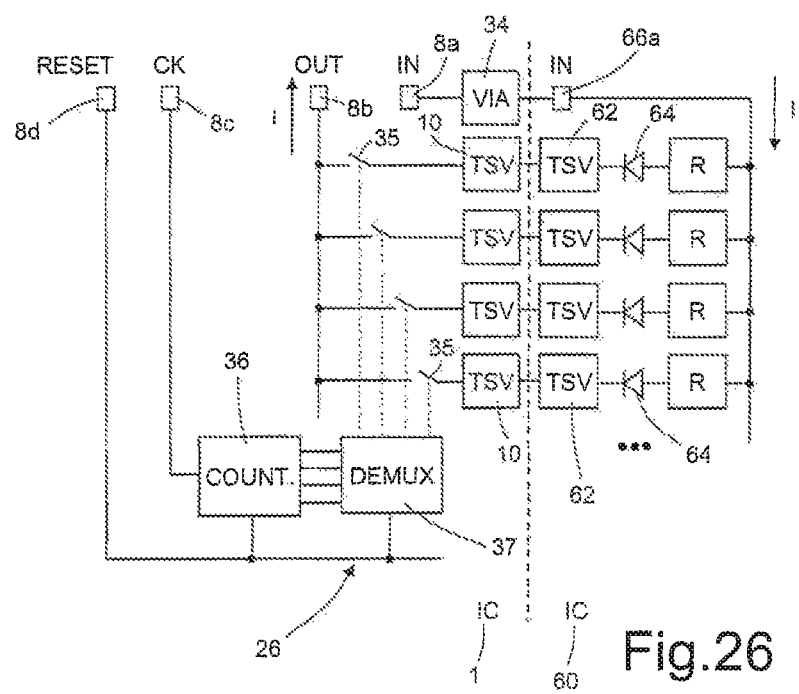
FIGS. 26, 28, 29, and 31 show respective circuit block diagrams of the interface stage of the test circuit, for the above three-dimensional stacked structures.

The electrical circuit of the resulting testing system, designed to carry out electrical testing of the through vias 10, 62 of both of the electronic integrated circuits 1, 60 of the three-dimensional stacked structure, is shown in FIG. 26 (it may be noted that operation of elements similar to that of others already described previously is not described again here; it may moreover be noted that in FIG. 26 a dashed line schematically separates the circuit components of the first electronic integrated circuit 1 from those of the second electronic integrated circuit 60). In particular, the test current I flows from the external testing apparatus (here not illustrated) towards the input pad 8a of the first electronic integrated circuit 1, then through the through interconnection 34 towards the input pad 66a of the second electronic integrated circuit 60. Inside the wafer 61, the test current I flows towards the doped region 65, and the corresponding semiconductor diode, and through the through via 62; again, within the first electronic integrated circuit 1, the test current I flows through the through via 10 and reaches, by means of the interface stage 26 of the test circuit 22, the output pad 8b to be measured by the testing apparatus.

It is noted that it is in this way possible to carry out test of the through vias 10, 62 of both of the electronic integrated circuits 1, 60, stacked on one another, directly from the test circuit 22 integrated in the wafer 2 of the first electronic integrated circuit 1, exploiting for the purpose the corresponding contact pads 8 accessible from outside. In particular, the testing apparatus, as well as the corresponding probes, do not need to access the second electronic integrated circuit 60 in the second wafer 61 in order to conduct the electrical test.

Figure 27:
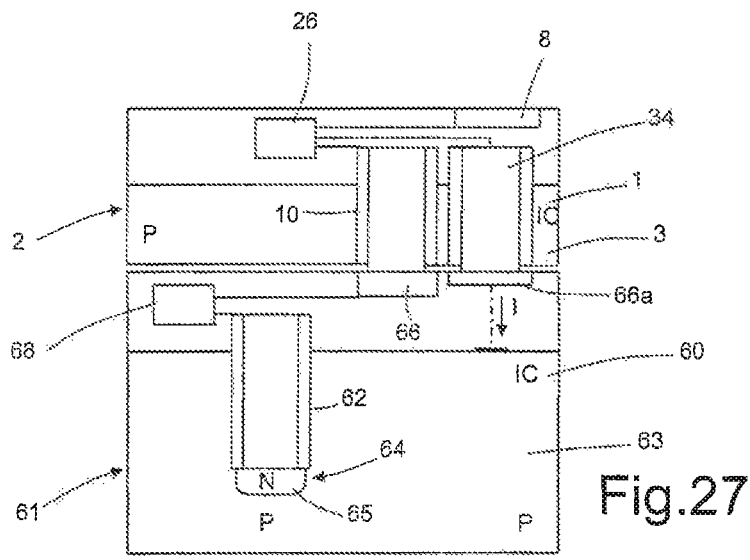

FIG. 27 is a schematic illustration of a further three-dimensional stacked structure, wherein both electronic integrated circuits 1, 60 are provided with an electronic test circuit equipped with an interface stage (provided substantially similarly to the above); in particular, the test circuit 64 of the second electronic integrated circuit 60 comprises an interface stage 68, which connects, via contact pads 66, the through vias 10, 62 of the two electronic integrated circuits 1, 60 that are to be tested.

Figure 28:
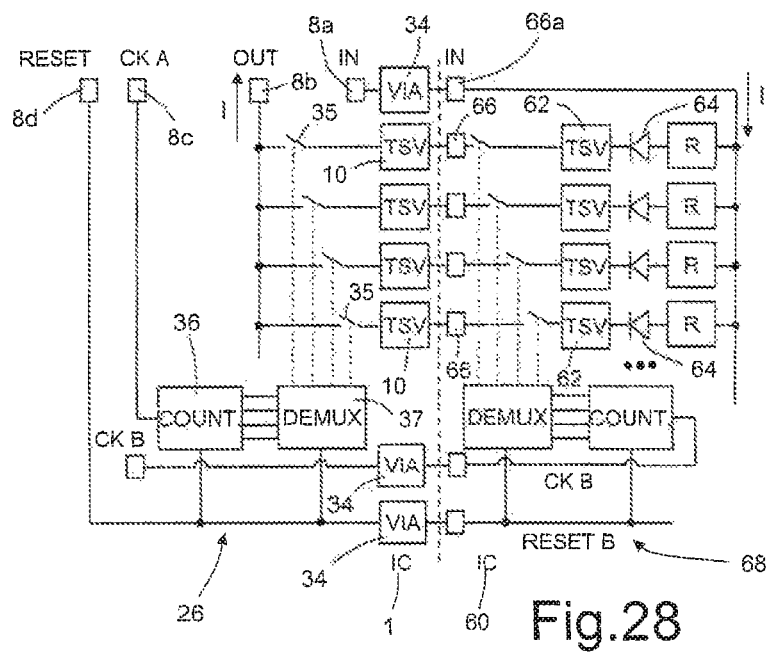

FIG. 28 shows the electrical circuit of the resulting testing system for the structure of FIG. 27; operation of the electrical circuit is in itself evident, in the light of the foregoing description. It should be noted in particular that the electronic integrated circuits 1, 60 use in the example different synchronism signals (designated by CKA and CKB), appropriately conveyed by through interconnections, which are also designated by 34, so as to control in a more accurate way the synchronism of the various electronic switches 35 along the path of the test current I. Alternatively, it is possible to supply a same synchronism signal to the two electronic integrated circuits 1, 60.

Figure 29:
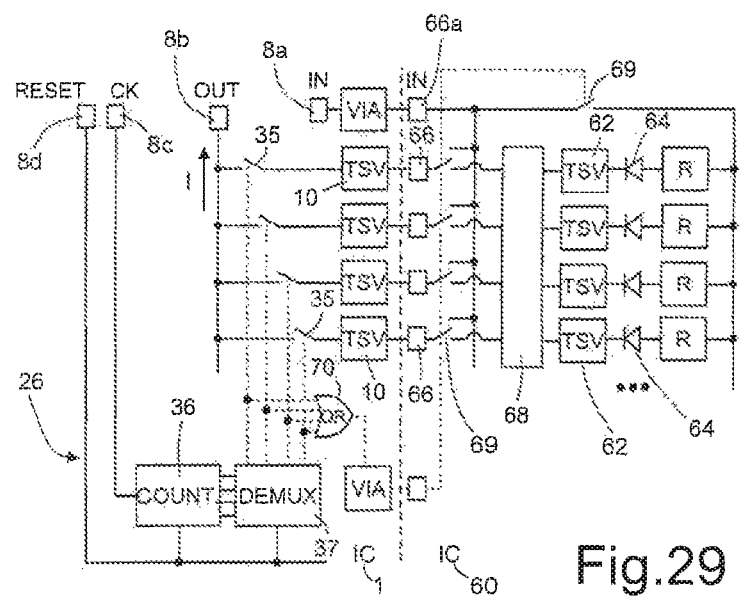

As shown in FIG. 29, the above electrical circuit may be modified so as to enable execution of the electrical test of just the through vias 10 of the first electronic integrated circuit 1 (it is noted that in FIG. 29, for simplicity of illustration, the interface stage 68 of the test circuit 64 of the second electronic integrated circuit 60 is shown schematically as a single block, and that, conceptually, this single block may possibly include at least part of said electronic integrated circuit 60).

In particular, a decoupling switch 69 is introduced in the testing system, arranged between the input pad 66a and the through vias 62 of the second electronic integrated circuit 60. The decoupling switch 69 receives, as control signal, the output of an OR decoupling logic gate 70 forming part of the first electronic integrated circuit 1, which in turn receives at its input the outputs of the demultiplexer 37 of the first electronic integrated circuit 1.

In use, by activating an appropriate test mode, it is possible to carry out the test of just the through vias 10 of the first integrated circuit 1, and of the corresponding electrical interconnections with the second wafer 61 (excluding from the test the through vias 62 of the second electronic integrated circuit 60). In particular, if any one of the electronic switches 35 of the first electronic integrated circuit 1 is activated in the test mode, the output of the OR decoupling logic gate 70 causes the through vias 62 of the second electronic integrated circuit 60 to be disconnected from the electrical test (and from the path of the test current I), enabling electrical testing of just the through vias 10 of the first electronic integrated circuit 1.

In a way not illustrated, the path of the test current I through the second wafer 61 may possibly be closed in a different way, for example by exploiting a circuit component (possibly parasitic, for example a diode of a parasitic type) of the second electronic integrated circuit 61, instead of envisaging the passage of the test current I through a through via 62 of the same second electronic integrated circuit 61.

Figure 30:
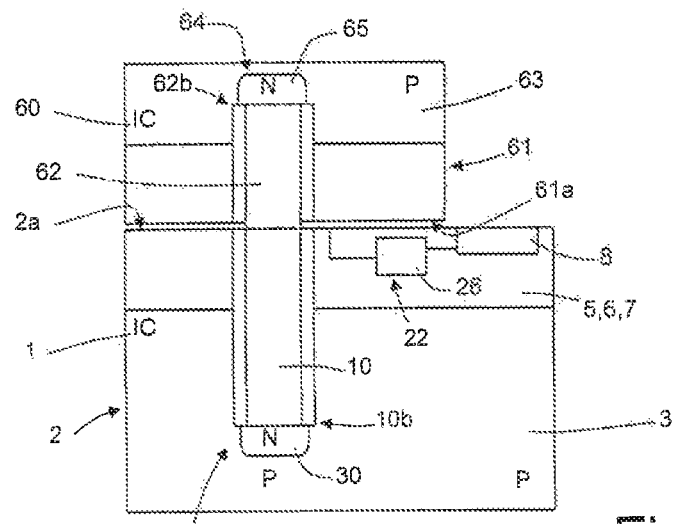

FIG. 30 shows a further embodiment of a three-dimensional stacked structure, in which the first and second wafers 2, 61 are stacked on one another in a face-to-face way, i.e., with the corresponding external front faces 2a, 61a in contact. In this example, the substrates 3, 63 of both the wafers 2, 61 have not been thinned, and the corresponding through vias 10, 62 have one back end 10b, 62b that is buried and is arranged in contact with a corresponding doped region 30, 65 (which forms the semiconductor diode of the buried microelectronic structures of the test circuits). The test circuit 22 of the first wafer 1 further comprises (unlike the test circuit 64 of the second wafer 62) an interface stage 26, connected to the contact pads 8, accessible from the front outer face 2a of the first wafer 2.

Figure 31:
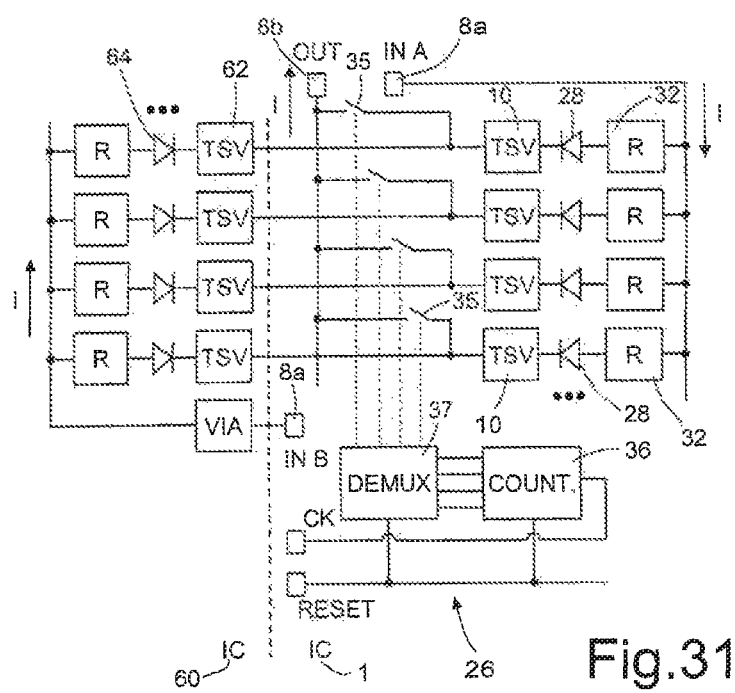

FIG. 31 shows a possible circuit embodiment of the testing system for the three-dimensional stacked structure of FIG. 30. It should be noted in particular that in this case two input pads 8a are provided (a first input pad designated by INA, and a second input pad designated by INB), both integrated in the first wafer 2, wherein the test current I for the electrical test of the first and second through vias 10, 62, respectively, is to be injected. The presence of the electronic switches 35 and of the semiconductor diodes in contact with the through vias 10, 62 enables in fact passage of the test current I alternatively from the first input pad (INA), through the first through vias 10 and then towards the single output pad 8b, or from the second input pad (INB), through the second through vias 62, and then towards the output pad 8b. In either situation, the interface stage 26 of the test circuit 22 of the first electronic integrated circuit 1 enables individual selection for electrical testing of each of the through vias 10, 62.

Advantages of one or more embodiments of the above-described testing system and method emerge clearly from the foregoing description.

In particular, it is emphasized again that the integration of appropriate test circuits within the wafers accommodating the through vias to be electrically tested may enable the use of test equipment of a traditional type, which in fact interface with the test circuits, instead of directly with the through vias. For example, it may be possible to use probes of a traditional type, which are arranged in contact with contact pads of the test circuits (instead of directly in contact with the through vias). The test circuits, in addition to connecting electrically with the through vias, enable testing of at least one electrical parameter thereof.

In this way it may be possible to provide through vias of a very small diameter, which may be tested even without the corresponding wafer being thinned, and possibly using test equipment of a traditional type.

Each test circuit may perform electrical testing of a plurality of through vias (in a number N that can in theory be as large as desired), requiring an extremely small number of input/output pads (thanks to the particular configuration of the interface stage of the test circuit) according to an embodiment.

In addition, the same testing system and the same test procedures may be used for testing the through vias both in an insulated chip or wafer and in a three-dimensional stacked structure made up of the superposition of a number of chips or wafers, electrically connected to one another, also during its obtainment.

Consequently, an embodiment enables amongst other things: use of traditional testing systems and equipment; absence of damage to the through vias (in so far as they do not enter into direct contact with the measurement probes); reduction of the problems of assembly; reduction of the losses of electrical efficiency due to the contact between the probes and the through vias (or the conductive elements associated thereto); reduction of the costs of the production and assembly processes; and elimination of the constraints in sizing the through vias and the mutual separation distances determined by the test equipment (and by the distances between the corresponding probes).

Finally, it is clear that modifications and variations may be made to what has been described herein and illustrated herein, without thereby departing from the scope of the present disclosure.

In particular, the buried microelectronic structure 28 of the test circuit 22 may vary with respect to the above (in any case, comprising at least one semiconductor junction arranged between the through via 10 to be tested and the substrate 3 so as to ensure, via an appropriate biasing, electrical insulation thereof).

Figure 32:
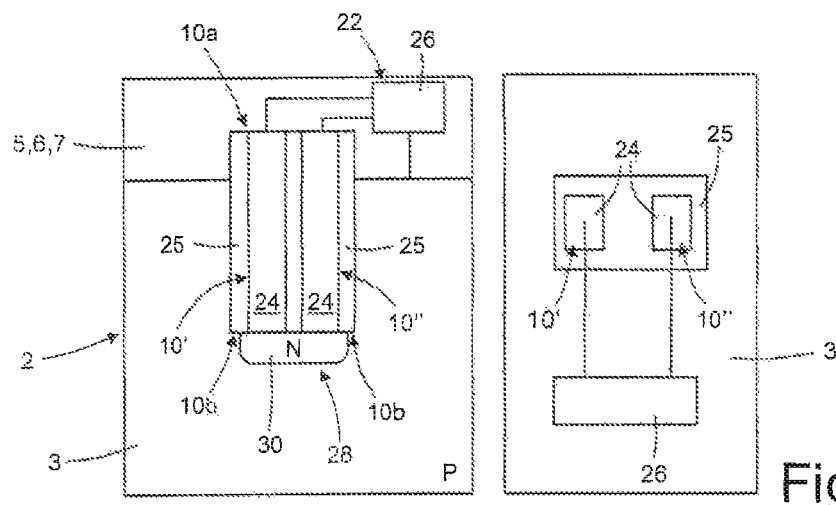
FIGS. 32-36 show variant embodiments of a buried microelectronic structure of the test circuit, integrated within the wafer of semiconductor material.

In an alternative embodiment, shown in FIG. 32, the buried microelectronic structure 28 forms, for example, a resistor buried within the substrate 3, for enabling electrical connection between the buried ends 10*b* of two through vias, designated by 10' and 10", arranged side by side and both having the surface end 10*a* connected to the interface stage 26 of the test circuit 22. In particular, in this case, the doped region 30, having a conductivity opposite with respect to the substrate 3 (for example, an N type conductivity), extends laterally in the substrate 3 so as to contact the conductive regions 24 of both of the through vias 10', 10". Again, the doped region 30 electrically insulates both through vias 10', 10" from the substrate 3.

Figure 33:
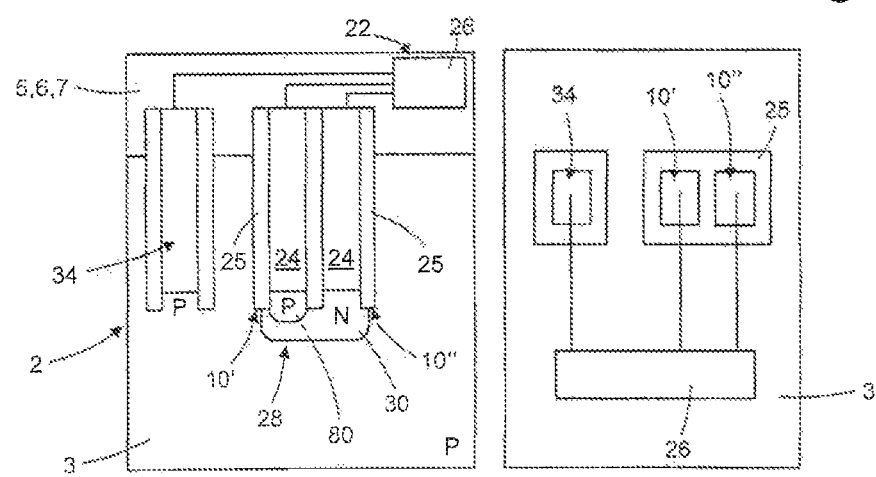

In a further variant embodiment (see FIG. 33), the buried microelectronic structure 28 provides a bipolar junction transistor (BJT) of a vertical type.

In detail, the doped region 30 here extends laterally underneath two through vias 10', 10" arranged side by side so as to insulate the respective conductive regions 24 thereof from the substrate 3 (in particular, the doped region 30 joins up at the bottom to the insulation regions 25 of the through vias 10', 10"). In addition, within the doped region 30, having an N type doping, a further doped region 80 is present, having an opposite type doping (in this case P type), arranged directly in contact with the conductive region 24 of one of the two through vias 10', 10" arranged side by side, laterally delimited by the corresponding insulation region 25. The further doped region 80 defines a first current-conduction terminal of the bipolar junction transistor (in this case connected to the through via 10'), having a base terminal formed by the doped region 30 (and here case connected to the through via 10"). A through interconnection 34 provides the electrical connection between the interface stage 26 of the test circuit 22 and the substrate 3, which here forms a second current-conduction terminal of the bipolar junction transistor. In use, the electrical test current I flows through the bipolar junction transistor from the first current-conduction terminal to the second current-conduction terminal, and traverses the through vias 10' and 10" to be tested, in addition to the through interconnection 34. It is to be noted that, if the doped region 80 is omitted, the doped region 30 may be conceptually similar to the channel of a JFET, of which the through interconnection 34 is the gate terminal.

Figure 34:
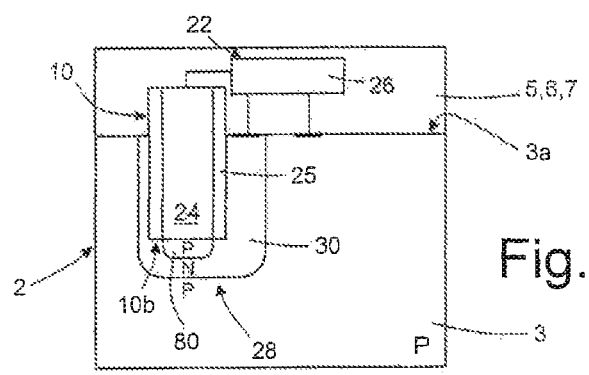

FIG. 34 shows a further structural variant, in which the buried microelectronic structure 28 forms again a vertical bipolar junction transistor. In this case, a single through via 10 is present, which is enclosed entirely, within the substrate 3, by the doped region 30 (which in this case encloses the through via 10 also laterally). Within the doped region 30, a further doped region 80 is formed at the back end 10*b* of the through via 10 and has an opposite type doping (here, P type), arranged directly in contact with the conductive region 24 of the through via 10, laterally delimited by the corresponding insulation region 25. The further doped region 80 defines also in this case a first current-conduction terminal of the bipolar junction transistor, having the base terminal formed by the doped region 30 and a second current-conduction terminal formed by the substrate 3. In this variant embodiment, both the substrate 3 and the doped region 30 are contacted directly by the interface stage 26 of the test circuit 22, via corresponding contact terminals arranged at the front surface 3*a* of the substrate.

Figure 35:
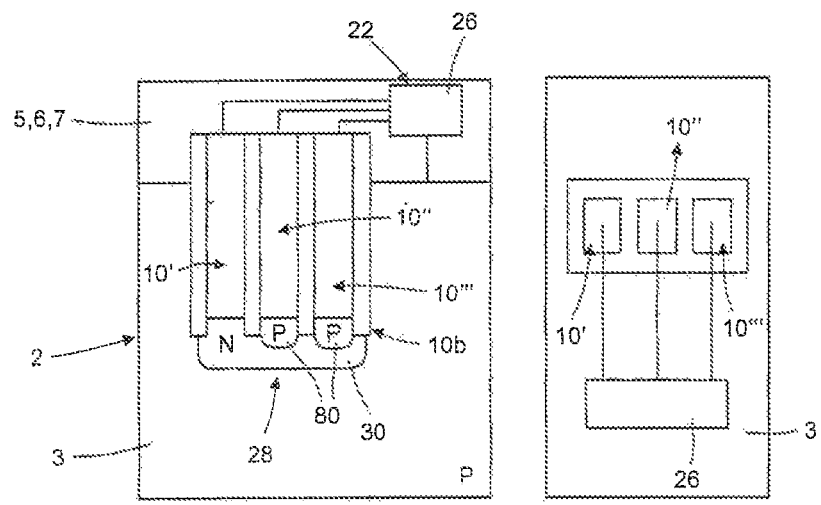

FIG. 35 shows a further embodiment, wherein the buried microelectronic structure 28 forms a bipolar junction transistor (BJT) of a lateral type.

In this case, the doped region 30, buried within the substrate 3, is arranged in contact with the buried ends of three through vias, designated by 10', 10" and 10''', arranged side by side within the wafer 2.

In the doped region 30 two further doped regions 80 are provided, each arranged in contact with the back end 10*b* of a respective through via (for example, of the through vias 10", 10'''). In this case, the doped region 30 defines the control terminal of the lateral bipolar junction transistor, while the further doped regions 80 define the first conduction terminal and the second conduction terminal of the same lateral bipolar junction transistor.

Figure 36:
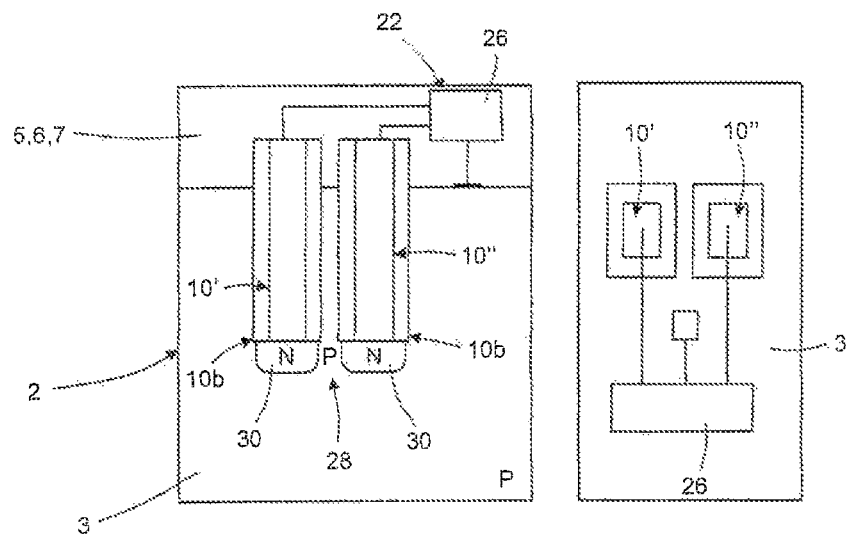

FIG. 36 shows a further variant embodiment in which the buried microelectronic structure 28 provides a bipolar junction transistor of a lateral type.

In this case, two through vias 10', 10" extend through the wafer 2 and have each a back end 10*b* arranged in contact with a doped region 30, having an opposite doping type to the substrate 3. The interface stage 26 of the test circuit 22 has a contact terminal directly connected to the substrate 3, which defines the control terminal of the bipolar junction transistor; the doped regions 30 form the current-conduction terminals of the same lateral bipolar junction transistor.

In general, it is evident that it may be possible to modify the test circuits presented, on the basis of specific requirements, or to implement circuits that contain only parts of the test circuits presented. Modifications and variations may moreover be made to what has been described, or it is possible to create hybrid forms, which may be obtained by combining two or more of the embodiments described or parts thereof, also in combination with the prior art, without thereby departing from the scope of the present disclosure.

In addition, it is evident that what has been described applies to electrical testing of through vias, irrespective of the method with which the through vias have been obtained (for example, irrespective of the use of the "via first" technique or else "via last" technique for their formation).

To provide the test circuit, and in particular the corresponding interface stage, components or parts already present in the electronic integrated circuit in the wafer may possibly be used, electrically coupled to the through vias that are to undergo electrical testing.

Furthermore, if the dimensions of the through vias so allow (for example, in the case of through vias through which high currents flow), the through vias may be possibly arranged in direct contact with a probe of the test equipment.

Finally, it is emphasized that the test circuit according to an embodiment may be configured for evaluating different electrical parameters of the through vias; for example, the electrical insulation from the substrate accommodating them may be evaluated for detecting the presence of a possible leakage towards the substrate through the lateral insulation of the through vias. In this case, the test circuit may be configured so as to enable application of a voltage to the semiconductor diode of the buried microelectronic structure such as to reversely bias, and so as to detect, any possible leakage of electrical current towards the substrate.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
    a substrate, comprising:
        a first semiconductor layer having a first top surface and a first bottom surface;
        a layer of insulating material having a top surface and a bottom surface, wherein the top surface of the layer of insulating material is in contact with the first bottom surface; and
        a second semiconductor layer having a second top surface and a second bottom surface, wherein the second top surface is in contact with the bottom surface of the layer of insulating material;
    a first tubular column of insulating material extending in said substrate through the first semiconductor layer and through the layer of insulating material and into the second semiconductor layer to a depth that does not reach the second bottom surface; and
    a first conductive material disposed within the first tubular column of insulating material, said first conductive material having a bottom surface in direct contact with the second semiconductor layer.

2. The apparatus of claim 1, wherein the first semiconductor layer is doped with a first conductivity type and wherein the second semiconductor layer is doped with the first conductivity type.

3. The apparatus of claim 1, further comprising an insulation extending above the first top surface, wherein the first tubular column of insulating material filled with the first conductive material further extends into the insulation.

4. The apparatus of claim 1, further comprising an integrated transistor device formed in the first top surface and electrically connected to the first conductive material disposed within the first tubular column of insulating material.

5. The apparatus of claim 1, wherein the first conductive material is a metal material.

6. The apparatus of claim 5, wherein the metal material is copper.

7. The apparatus of claim 5, wherein the second semiconductor layer is doped with a first conductivity type and further including a semiconductor region more highly doped with the first conductivity type than the second semiconductor layer that is located at an interface between the bottom surface of the first conductive material and the second semiconductor layer.

8. The apparatus of claim 1, further comprising:
    a second tubular column of insulating material extending in said substrate through the first semiconductor layer and through the layer of insulating material and into the second semiconductor layer to a depth that does not reach the second bottom surface; and
    wherein the second semiconductor layer is doped with a first conductivity type;
    a region of the second semiconductor layer doped with a second conductivity type that is located at a bottom of the second tubular column of insulating material; and
    a second conductive material disposed within the second tubular column of insulating material, said second conductive material having a bottom surface in direct contact with the region of the second semiconductor layer that is doped with the second conductivity type.

9. The apparatus of claim 8, further comprising an integrated transistor device formed in the first semiconductor layer and electrically connected to the second conductive material within the second tubular column of insulating material.

10. The apparatus of claim 8, further comprising a testing circuit configured to generate a testing current applied to the first conductive material to flow therethrough and into said second semiconductor layer and further flow through the region of the second semiconductor layer that is doped with the second conductivity type and still further flow through the second conductive material.

11. The apparatus of claim 8, wherein the second conductive material is a metal material.

12. The apparatus of claim 11, wherein the metal material is copper.

13. The apparatus of claim 1, further comprising a testing circuit configured to generate a testing current applied to first conductive material to flow therethrough and into said second semiconductor layer.

14. An apparatus, comprising:
    a first semiconductor layer having a first top surface and a first bottom surface, said first semiconductor layer doped with a first conductivity type;
    a second semiconductor layer having a second top surface and a second bottom surface, said second semiconductor layer doped with the first conductivity type;
    an insulating layer in contact with the first top surface and the second bottom surface;
    a first tubular column of insulating material extending through the second semiconductor layer and through the insulating layer into said first semiconductor substrate layer to a first depth that does not reach the first bottom surface;
    a second tubular column of insulating material extending through the second semiconductor layer and through the insulating layer into said first semiconductor substrate layer to a second depth that does not reach the first bottom surface;
    a region of the first semiconductor layer doped with a second conductivity type that is located at a bottom of the second tubular column of insulating material;
    a first conductive material within the first tubular column of insulating material and in contact with the first semiconductor layer; and
    a second conductive material within the second tubular column of insulating material and in contact with the region of the first semiconductor layer doped with the second conductivity type.

15. The apparatus of claim 14, further comprising integrated circuitry formed in the second semiconductor layer and electrically connected to the first and second conductive materials.

16. The apparatus of claim 14, further comprising a testing circuit configured to generate a testing current applied to first conductive material to flow therethrough and into said first semiconductor layer and further flow through the region of the first semiconductor layer that is doped with the second conductivity type and still further flow through the second conductive material.

17. The apparatus of claim 14, wherein the first and second conductive materials are each a metal material.

18. The apparatus of claim 17, wherein the metal material is copper.

19. An apparatus, comprising:
a first semiconductor layer of a first conductivity type having a first top surface and a first bottom surface;
a first tubular column of insulating material extending into said first semiconductor layer to a depth that does not reach the first bottom surface; and
a first metal material that completely fills within the first tubular column of insulating material, said first metal material having a bottom surface in direct contact with the first semiconductor layer.

20. The apparatus of claim 19, further comprising:
a second tubular column of insulating material coaxial with and surrounding the first tubular column of insulating material and extending into said first semiconductor layer to a depth that does not reach the first bottom surface;
a region of the first semiconductor layer doped with a second conductivity type that is located at a bottom of the first tubular column of insulating material; and
a second metal material filling between the first and second tubular columns of insulating material.

21. The apparatus of claim 20, further comprising a testing circuit configured to generate a testing current applied to said second metal material to flow therethrough and into said first semiconductor layer and further flow through the region of the first semiconductor layer that is doped with the second conductivity type and still further flow through the first conductive material.

22. An apparatus, comprising:
a substrate, comprising:
a first semiconductor layer having a first top surface and a first bottom surface;
an insulating layer having a top surface and a bottom surface, wherein the top surface of the an insulating layer is in contact with the first bottom surface; and
a second semiconductor layer having a second top surface and a second bottom surface, wherein the second top surface is in contact with the bottom surface of the insulating layer;
a first tubular column of insulating material extending in said substrate through the first semiconductor layer and through the insulating layer and into the second semiconductor layer to a depth that does not reach the second bottom surface; and
a first conductive material disposed within the first tubular column of insulating material, said first conductive material having a bottom surface in contact with the second semiconductor layer, wherein the first conductive material is a metal material,
wherein the second semiconductor layer is doped with a first conductivity type and further including a semiconductor region more highly doped with the first conductivity type than the second semiconductor layer that is located at an interface between the bottom surface of the first conductive material and the second semiconductor layer.

23. The apparatus of claim 22, wherein the first semiconductor layer is doped with a first conductivity type and wherein the second semiconductor layer is doped with the first conductivity type.

24. The apparatus of claim 22, further comprising an insulation extending above the first top surface, wherein the first tubular column of insulating material filled with the first conductive material further extends into the insulation.

25. The apparatus of claim 22, further comprising an integrated transistor device formed in the first top surface and electrically connected to the first conductive material disposed within the first tubular column of insulating material.

26. The apparatus of claim 22, wherein the metal material is copper.

27. An apparatus, comprising:
a substrate, comprising:
a first semiconductor layer having a first top surface and a first bottom surface;
an insulating layer having a top surface and a bottom surface, wherein the top surface of the an insulating layer is in contact with the first bottom surface; and
a second semiconductor layer having a second top surface and a second bottom surface, wherein the second top surface is in contact with the bottom surface of the insulating layer and wherein the second semiconductor layer is doped with a first conductivity type;
a first tubular column of insulating material extending in said substrate through the first semiconductor layer and through the insulating layer and into the second semiconductor layer to a depth that does not reach the second bottom surface; and
a first conductive material disposed within the first tubular column of insulating material, said first conductive material having a bottom surface in contact with the second semiconductor layer;
a second tubular column of insulating material extending in said substrate through the first semiconductor layer and through the insulating layer and into the second semiconductor layer to a depth that does not reach the second bottom surface;
a region of the second semiconductor layer doped with a second conductivity type that is located at a bottom of the second tubular column of insulating material; and
a second conductive material disposed within the second tubular column of insulating material, said second conductive material having a bottom surface in contact with the region of the second semiconductor layer that is doped with the second conductivity type.

28. The apparatus of claim 27, further comprising an integrated transistor device formed in the first semiconductor layer and electrically connected to the second conductive material within the second tubular column of insulating material.

29. The apparatus of claim 27, further comprising a testing circuit configured to generate a testing current applied to the first conductive material to flow therethrough and into said second semiconductor layer and further flow through the region of the second semiconductor layer that is doped with the second conductivity type and still further flow through the second conductive material.

30. The apparatus of claim 27, wherein the second conductive material is a metal material.

31. The apparatus of claim 30, wherein the metal material is copper.

32. The apparatus of claim 27, further comprising a testing circuit configured to generate a testing current applied to first conductive material to flow therethrough and into said second semiconductor layer.

* * * * *